(12) United States Patent
Tan et al.

(10) Patent No.: US 12,345,529 B2
(45) Date of Patent: *Jul. 1, 2025

(54) SELF-MIXING INTERFERENCE DEVICE FOR SENSING APPLICATIONS

(71) Applicant: Apple Inc., Cupertino, CA (US)

(72) Inventors: Fei Tan, Sunnyvale, CA (US); Arnaud Laflaquiere, Paris (FR); Chin Han Lin, Santa Clara, CA (US); Keith Lyon, San Jose, CA (US); Marc A. Drader, Waterloo (CA); Weiping Li, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/094,255

(22) Filed: Jan. 6, 2023

(65) Prior Publication Data

US 2023/0152081 A1 May 18, 2023

Related U.S. Application Data

(63) Continuation of application No. 16/913,645, filed on Jun. 26, 2020, now Pat. No. 11,549,799.
(Continued)

(51) Int. Cl.
*G01C 3/08* (2006.01)
*G01B 9/02* (2022.01)
(Continued)

(52) U.S. Cl.
CPC ..... *G01B 9/02097* (2013.01); *G01B 9/02092* (2013.01); *G01B 11/026* (2013.01);
(Continued)

(58) Field of Classification Search
CPC ... G01B 9/02097; G01B 11/026; G01S 17/34; G01S 7/4916; H01S 5/0262; H01S 5/183; H01S 5/3095
See application file for complete search history.

(56) References Cited

U.S. PATENT DOCUMENTS 5,539,562 A 7/1996 Morioka
5,974,071 A 10/1999 Jiang et al.
(Continued)

FOREIGN PATENT DOCUMENTS

CN 2738434 11/2005
CN 101592605 12/2009
(Continued)

OTHER PUBLICATIONS

U.S. Appl. No. 17/480,704, filed Sep. 21, 2021, Chen et al.
(Continued)

*Primary Examiner* — Mark Hellner
(74) *Attorney, Agent, or Firm* — Brownstein Hyatt Farber Schreck, LLP

(57) ABSTRACT

Disclosed herein are self-mixing interferometry (SMI) sensors, such as may include vertical cavity surface emitting laser (VCSEL) diodes and resonance cavity photodetectors (RCPDs). Structures for the VCSEL diodes and RCPDs are disclosed. In some embodiments, a VCSEL diode and an RCPD are laterally adjacent and formed from a common set of semiconductor layers epitaxially formed on a common substrate. In some embodiments, a first and a second VCSEL diode are laterally adjacent and formed from a common set of semiconductor layers epitaxially formed on a common substrate, and an RCPD is formed on the second VCSEL diode. In some embodiments, a VCSEL diode may include two quantum well layers, with a tunnel junction layer between them. In some embodiments, an RCPD may be vertically integrated with a VCSEL diode.

19 Claims, 15 Drawing Sheets

Related U.S. Application Data

(60) Provisional application No. 62/869,442, filed on Jul. 1, 2019.

(51) Int. Cl.
*G01B 9/02097* (2022.01)
*G01B 11/02* (2006.01)
*G01S 7/4912* (2020.01)
*G01S 17/34* (2020.01)
*H01S 5/026* (2006.01)
*H01S 5/183* (2006.01)
*H01S 5/30* (2006.01)
*H01S 5/343* (2006.01)

(52) U.S. Cl.
CPC ............ *G01S 7/4916* (2013.01); *G01S 17/34* (2020.01); *H01S 5/0262* (2013.01); *H01S 5/183* (2013.01); *H01S 5/18313* (2013.01); *H01S 5/3095* (2013.01); *H01S 5/3432* (2013.01)

(56) References Cited

U.S. PATENT DOCUMENTS

| | | |
|---|---|---|
| 5,978,401 A | 11/1999 | Morgan |
| 6,055,262 A | 4/2000 | Cox et al. |
| 6,253,097 B1 | 6/2001 | Aronow et al. |
| 6,272,269 B1 | 8/2001 | Naum |
| 6,310,707 B1 | 10/2001 | Kawase et al. |
| 6,348,684 B1 | 2/2002 | Nykolak et al. |
| 6,459,835 B1 | 10/2002 | Nagaoka et al. |
| 6,574,398 B2 | 6/2003 | Coldren et al. |
| 6,592,245 B1 | 7/2003 | Tribelsky et al. |
| 6,597,713 B2 | 7/2003 | Ouchi |
| 6,636,539 B2 | 10/2003 | Martinsen |
| 6,814,901 B2 | 11/2004 | Itoh |
| 6,829,442 B2 | 12/2004 | Murray |
| 6,931,042 B2 | 8/2005 | Choquette et al. |
| 6,967,754 B2 | 11/2005 | Bratt et al. |
| 6,987,306 B2 | 1/2006 | Fathimulla et al. |
| 7,030,359 B2 | 4/2006 | Römhild |
| 7,157,298 B2 | 1/2007 | Nakayama et al. |
| 7,264,408 B2 | 9/2007 | Togami et al. |
| 7,277,463 B2 | 10/2007 | Guenter |
| 7,286,766 B2 | 10/2007 | Shelton |
| 7,324,574 B2 | 1/2008 | Kim |
| 7,349,604 B2 | 3/2008 | Clark |
| 7,446,359 B2 | 11/2008 | Lee et al. |
| 7,692,859 B2 | 4/2010 | Redert |
| 7,791,591 B2 | 9/2010 | Collins et al. |
| 7,804,875 B2 | 9/2010 | Park et al. |
| 8,038,822 B2 | 10/2011 | Kindler |
| 8,073,343 B2 | 12/2011 | Yuki et al. |
| 8,113,724 B2 | 2/2012 | Terada et al. |
| 8,153,502 B2 | 4/2012 | Li |
| 8,319,311 B2 | 11/2012 | Chen |
| 8,457,170 B2 | 6/2013 | Gerlach |
| 8,467,428 B2 | 6/2013 | Gerlach et al. |
| 8,598,673 B2 | 12/2013 | Joshi |
| 8,783,893 B1 | 7/2014 | Seurin et al. |
| 8,823,859 B2 | 9/2014 | Fujimori et al. |
| 8,890,844 B2 | 11/2014 | Hung et al. |
| 8,917,752 B2 | 12/2014 | Chung |
| 8,976,158 B2 | 3/2015 | Eriksson et al. |
| 8,988,574 B2 | 3/2015 | Oshima et al. |
| 8,995,841 B1 | 3/2015 | Chalfant, III et al. |
| 9,091,747 B2 | 7/2015 | Pruijmboom |
| 9,112,330 B2 | 8/2015 | Gronenborn et al. |
| 9,164,625 B2 | 10/2015 | Holmgren et al. |
| 9,171,723 B2 | 10/2015 | Hallam |
| 9,215,293 B2 | 12/2015 | Miller |
| 9,305,967 B1 | 4/2016 | Tharumalingam |
| 9,312,954 B2 | 4/2016 | Chen et al. |
| 9,318,873 B2 | 4/2016 | Nagatomo |
| 9,397,476 B2 | 7/2016 | Baier |
| 9,406,716 B2 | 8/2016 | Lin |
| 9,525,093 B2 | 12/2016 | Costello et al. |
| 9,544,539 B2 | 1/2017 | Roman |
| 9,612,390 B2 | 4/2017 | Thompson et al. |
| 9,684,074 B2 | 6/2017 | Schrank et al. |
| 9,799,727 B2 | 10/2017 | Zhou |
| 9,810,862 B2 | 11/2017 | Graves et al. |
| 9,825,086 B2 | 11/2017 | Kawahara |
| 9,860,965 B2 | 1/2018 | Recker et al. |
| 9,917,643 B2 | 3/2018 | Shatz et al. |
| 9,929,806 B2 | 3/2018 | Wabnig et al. |
| 9,998,217 B2 | 6/2018 | Li et al. |
| 10,031,158 B1 | 7/2018 | Douglas et al. |
| 10,032,946 B2 | 7/2018 | Lanzara et al. |
| 10,072,815 B2 | 9/2018 | MacKinnon et al. |
| 10,148,365 B2 | 12/2018 | Sundaram |
| 10,177,186 B2 | 1/2019 | Wang |
| 10,181,895 B2 | 1/2019 | Liu |
| 10,222,475 B2 | 3/2019 | Pacala et al. |
| 10,267,505 B2 | 4/2019 | Van de Sluis et al. |
| 10,293,691 B2 | 5/2019 | Mishra et al. |
| 10,305,605 B2 | 5/2019 | Sun et al. |
| 10,353,130 B2 | 7/2019 | Vandenberg et al. |
| 10,367,021 B2 | 7/2019 | Jangjian |
| 10,371,328 B2 | 8/2019 | Poage |
| 10,473,764 B2 | 11/2019 | Townsend |
| 10,476,591 B2 | 11/2019 | Laycock |
| 10,511,383 B2 | 12/2019 | Tiecke et al. |
| 10,571,680 B2 | 2/2020 | Igarashi |
| 10,574,916 B2 | 2/2020 | Fukuda |
| 10,601,507 B2 | 3/2020 | Wabnig et al. |
| 10,663,586 B2 | 5/2020 | Pacala et al. |
| 10,700,780 B2 | 6/2020 | Momtahan et al. |
| 10,705,347 B2 | 7/2020 | Chen et al. |
| 10,756,815 B2 | 8/2020 | Shih et al. |
| 10,764,053 B2 | 9/2020 | Brook et al. |
| 10,840,396 B2 | 11/2020 | Balimann et al. |
| 10,871,820 B2 | 12/2020 | Mutlu et al. |
| 10,903,913 B2 | 1/2021 | Sundaram |
| 10,911,727 B2 | 2/2021 | MacKinnon |
| 10,935,215 B1 | 3/2021 | Lin et al. |
| 10,948,567 B2 | 3/2021 | Eberspach et al. |
| 11,099,347 B2 | 8/2021 | Takenaka et al. |
| 11,119,219 B1 | 9/2021 | LaChapelle et al. |
| 11,157,113 B2 | 10/2021 | Winkler et al. |
| 11,169,446 B2 | 11/2021 | Dietrich et al. |
| 11,187,643 B2 | 11/2021 | Jutte et al. |
| 11,201,669 B2 | 12/2021 | Momtahan et al. |
| 11,303,355 B2 | 4/2022 | Momtahan |
| 11,381,060 B2 | 7/2022 | Laflaquiere et al. |
| 11,381,307 B2 | 7/2022 | Joseph |
| 11,448,736 B2 | 9/2022 | Hosseini et al. |
| 11,549,799 B2 * | 1/2023 | Tan .................. G01B 11/026 |
| 11,789,156 B1 | 10/2023 | Michaels et al. |
| 2003/0036356 A1 | 2/2003 | Witehira et al. |
| 2003/0043435 A1 | 3/2003 | Oettinger et al. |
| 2003/0053506 A1 | 3/2003 | Coldren |
| 2004/0057228 A1 | 3/2004 | Huang et al. |
| 2005/0040410 A1 | 2/2005 | Ledentsov et al. |
| 2005/0168445 A1 | 8/2005 | Piot et al. |
| 2005/0224701 A1 | 10/2005 | Austin |
| 2006/0103941 A1 | 5/2006 | Yamaguchi et al. |
| 2007/0133642 A1 | 6/2007 | Park et al. |
| 2011/0278692 A1 | 11/2011 | Takeuchi et al. |
| 2012/0006382 A1 | 1/2012 | Dagli et al. |
| 2012/0019695 A1 | 1/2012 | Qian et al. |
| 2014/0213034 A1 | 7/2014 | Chang et al. |
| 2015/0144918 A1 | 5/2015 | Cho et al. |
| 2015/0311673 A1 | 10/2015 | Wang et al. |
| 2016/0178884 A1 | 6/2016 | Hanada et al. |
| 2018/0278828 A1 | 9/2018 | Moon |
| 2018/0341094 A1 | 11/2018 | Brukilacchio |
| 2019/0331473 A1 | 10/2019 | Johnson et al. |
| 2020/0370922 A1 | 11/2020 | Mort et al. |
| 2021/0116355 A1 * | 4/2021 | Spruit .................. G01S 7/4916 |
| 2022/0231761 A1 | 7/2022 | Momtahan |
| 2023/0089141 A1 | 3/2023 | Chen et al. |

(56) References Cited

U.S. PATENT DOCUMENTS

| | | |
|---|---|---|
| 2023/0213629 A1 | 7/2023 | Zhou et al. |
| 2024/0102852 A1 | 3/2024 | Hui et al. |
| 2024/0384980 A1 | 11/2024 | Chen et al. |

FOREIGN PATENT DOCUMENTS

| | | | |
|---|---|---|---|
| CN | 102427573 | 4/2012 | |
| CN | 102575925 | 7/2012 | |
| CN | 105716526 | 6/2016 | |
| CN | 109154552 | 1/2019 | |
| CN | 109428261 | 3/2019 | |
| EP | 3176888 | 6/2017 | |
| EP | 3176888 A1 * | 6/2017 | ........... H01S 5/0078 |
| EP | 3651290 A1 * | 5/2020 | ........... G01J 1/4257 |
| JP | 2000174543 | 6/2000 | |
| JP | 2004047636 | 2/2004 | |
| JP | 2006203111 | 8/2006 | |
| KR | 1020070061191 | 6/2007 | |
| KR | 1020190039927 | 4/2019 | |
| WO | WO 10/111961 | 10/2010 | |
| WO | WO 17/218467 | 12/2017 | |
| WO | WO-2017218467 A1 * | 12/2017 | ......... G01B 9/02015 |
| WO | WO 18/128904 | 7/2018 | |
| WO | WO 22/112679 | 6/2022 | |
| WO | WO 23/003550 | 1/2023 | |

OTHER PUBLICATIONS

U.S. Appl. No. 18/077,988, filed Dec. 8, 2022, Hui et al.

Huang et al., "A nanoelectromechanical tunable laser," *nature photonics*, vol. 2, Mar. 2008, pp. 180-184.

Leitgeb et al., "Using Tapers for Efficient Coupling of Received FSO-Signals into Fibres," 13th International Conference on Transparent Optical Networks in Stockholm, Sweden, Jun. 26-30, 2011, Institute of Broadband Communications, University of Technology, Graz, Austria, pp. 1-6.

U.S. Appl. No. 18/143,517, filed May 4, 2023, Lin et al.

Sayyah et al., "Fully Integrated FMCW LiDAR Optical Engine on a Single Silicon Chip," *Journal of Lightwave Technology*, vol. 40, No. 9, May 1, 2022, pp. 2763-2772.

\* cited by examiner

SELF-MIXING INTERFERENCE DEVICE FOR SENSING APPLICATIONS

CROSS-REFERENCE TO RELATED APPLICATIONS

This application is a continuation of U.S. patent application Ser. No. 16/913,645, filed Jun. 26, 2020, which is a nonprovisional of and claims the benefit under 35 U.S.C. 119(e) of U.S. Provisional Patent Application No. 62/869,442, filed Jul. 1, 2019, the contents of which are incorporated herein by reference as if fully disclosed herein.

FIELD

The present disclosure generally relates to structures and configurations of vertical cavity surface emitting laser (VCSEL) diodes and associated photodetectors (PDs), such as resonant cavity photodetectors (RCPDs). The VCSEL diodes and associated PDs may be part of sensors or detectors that measure or determine displacement, distance, motion, speed, or velocity of a surface or an object. Such detectors or sensors may be directed to determining force or touch inputs on an electronic device.

The VCSEL diode and/or its associated RCPD may make use of self-mixing interference caused by reflections or backscatter of laser light emitted by the VCSEL diode. With self-mixing interference, the received reflections induce in the VCSEL diode a change or an altered state of the emitted laser light from the state of the emitted laser light without received reflections. The change in the emitted laser light may be correlated to a distance or motion of an object or target (such as an electronic device's input surface).

BACKGROUND

Electronic devices are commonplace in today's society. Example electronic devices include cell phones, tablet computers, personal digital assistants, and the like. Some of these electronic devices include one or more input elements or surfaces, such as buttons or touch screens, through which a user may enter commands or data by applying a touch or a press. The touch or press may be detected by components of the electronic device that detect displacement or motion of the input elements or surfaces.

Such detection components may make use of light sources in which a light beam, such as a laser, is emitted toward the input surface. Detection of displacement or movement of the input surface may be inferred from reflections or backscatter of the emitted laser light from the input surface.

A particular category of such detection components may include VCSEL diodes. A VCSEL diode may undergo self-mixing interference, in which reflections of its emitted laser light are received back into its lasing cavity and shift a property of the emitted laser light, such as wavelength, to a different state from what it would be in the absence of received reflections (i.e., free emission). In the case that the received reflections are from an input surface, the shift in the property may be correlated with the displacement or motion of the input surface.

SUMMARY

This summary is provided to introduce a selection of concepts in simplified form that are further described below in the Detailed Description section. This summary is not intended to identify key features or essential features of the claimed subject matter, nor is it intended to be used as an aid in determining the scope of the claimed subject matter.

Disclosed herein are self-mixing interferometry sensors. The self-mixing interferometry sensors may include a vertical cavity surface emitting laser (VCSEL) diode and a resonant cavity photodetector (RCPD). The VCSEL diode and the RCPD may be formed from a common set of semiconductor layers.

In a first embodiment, a self-mixing interferometry sensor may include a VCSEL diode and an RCPD that is laterally adjacent to the VCSEL diode. The VCSEL and the RCPD may include a common set of semiconductor layers formed on a common substrate that includes an active region layer. The VCSEL diode and the RCPD may be at least partially separated by a trench through the common set of semiconductor layers, extending through the active region layer. The VCSEL diode may include additional semiconductor layers stacked with the common set of semiconductor layers.

The VCSEL diode may be configured to emit a laser light under forward bias and undergo self-mixing interference caused by first reflections or backscatters of the emitted laser light from an object, with the self-mixing interference altering a property of the emitted laser light. The RCPD may be configured to be reverse biased during emission of the laser light by the VCSEL diode and receive second reflections or backscatters of the emitted laser light from the object, and the RCPD may produce a measurable parameter related to the altered property of the emitted laser light.

In further embodiments, the additional semiconductor layers may be formed on the common set of semiconductor layers, and may include an etch stop layer, which may be Indium Gallium Phosphide, adjacent to the common set of semiconductor layers. A bias supply electrical contact may be connected to a layer of the additional semiconductor layers farthest from the common set of semiconductor layers. In various embodiments, the VCSEL diode may be configured to have a natural wavelength of 940 nanometers (nm), 850 nm, 1060 nm, or another natural wavelength.

In another embodiment, a self-mixing interferometry sensor may include a first and a second VCSEL diode, the second VCSEL diode being laterally adjacent to the first VCSEL diode. The first VCSEL diode and the second VCSEL diode include a common set of semiconductor layers formed on a common substrate including an active region layer. The self-mixing interferometry sensor may also include an RCPD positioned vertically adjacent to the second VCSEL diode on a side of the second VCSEL diode opposite to the common substrate. The first VCSEL diode and the second VCSEL diode are at least partially separated by a trench through the common set of semiconductor layers.

The first VCSEL diode may be configured to emit a laser light while forward biased and undergo self-mixing interference caused by receiving first reflections or backscatters from an object, with the self-mixing interference altering a property of the emitted laser light. The RCPD and the second VCSEL diode may be configured to be reverse biased during emission of the laser light by the first VCSEL diode. The RCPD may be configured to receive second reflections or backscatters of the emitted laser light from the object, and the altered property of the emitted laser light may be detectable using a measured parameter of the RCPD.

In some embodiments, the RCPD may include a tunnel junction layer containing a first semiconductor material, which may be Indium Gallium Arsenide, different from a second semiconductor material in the active region layer. There may be an etch stop layer, which may be Indium Gallium Phosphide, between the RCPD and the second VCSEL diode. In one example, the VCSEL diode may be configured to emit the laser light with a natural wavelength of 940 nanometers, but in other embodiments the VCSEL may have a natural wavelength of 850 nm, 1060 nm, or yet another natural wavelength.

The active region layer may include a first active region layer, a second active region layer and a tunnel junction layer between the first active region layer and the second active region layer.

In still another embodiment, a self-mixing interferometry sensor may include a VCSEL diode and an RCPD vertically adjacent to the VCSEL diode. The RCPD may include a first set of semiconductor layers formed on a substrate, and the VCSEL diode may include a second set of semiconductor layers formed on the first set of semiconductor layers opposite to the substrate. The VCSEL diode may be configured to emit laser light when forward biased and undergo self-mixing interference upon reception of reflections or backscatters of the emitted laser light from an object, the self-mixing interference altering a property of the emitted laser light. The RCPD may be configured to be reverse biased during emission of the laser light by the VCSEL diode and to detect the alteration in the property of the emitted laser light. There may be an etch stop layer, which may be Indium Gallium Phosphide, between the first set of semiconductor layers and the second set of semiconductor layers. The VCSEL diode may be configured to emit the laser light with a natural wavelength of 940 nm, 850 nm, 1060 nm or still another natural wavelength.

BRIEF DESCRIPTION OF THE DRAWINGS

The disclosure will be readily understood by the following detailed description in conjunction with the accompanying drawings, wherein like reference numerals designate like structural elements.

Figure 1A:
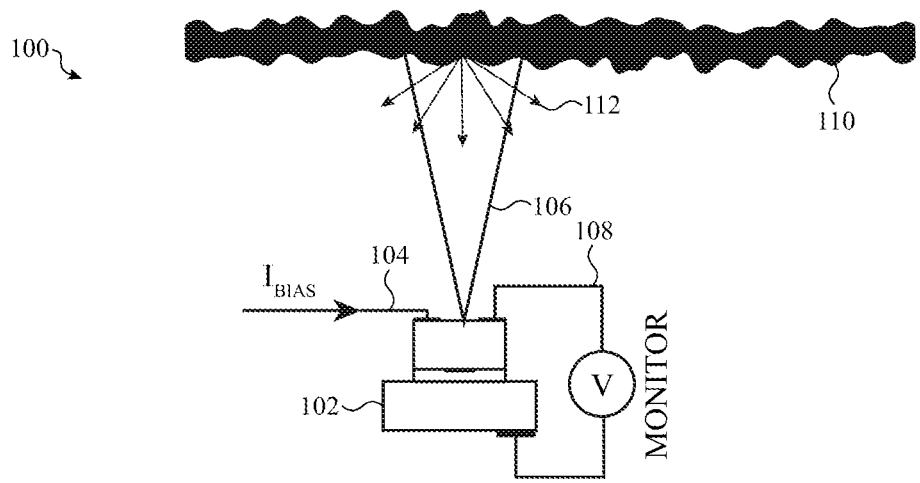
FIG. 1A illustrates a first configuration using a vertical cavity surface emitting laser (VCSEL) diode for sensing an object, according to an embodiment.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to self-mixing interferometry sensors, such as may be used for touch or input sensors, and to their structures. Such self-mixing interferometry sensors may use vertical cavity surface emitting laser (VCSEL) diodes and associated resonance cavity photodetectors (RCPDs). An electronic device may use such an self-mixing interferometry sensor as part of detecting a displacement, distance, motion, speed, or velocity of an input surface, such as a touch screen. Hereinafter, for convenience, all such possibly measured parameters will be referred to as simply "displacement or motion."

Such self-mixing interferometry sensors detect the displacement or motion by causing one or more VCSEL diodes to emit a laser light toward the input surface or an object (hereinafter, just "object") by applying a forward bias.

Reflections of the emitted laser light from the input surface or object can be received back into the lasing cavity of the VCSEL diode. This can cause self-mixing interference in which there is a shift in the wavelength of the emitted laser light to a new altered value. This shift in the wavelength can be correlated to the displacement or motion of the object.

Other reflections of the emitted laser light may be concurrently detected by an RCPD, whose structure may include a p-n diode junction. Under a reverse voltage bias, no significant current flows through the p-n junction of the RCPD. But the received reflections of the emitted laser light can induce a photocurrent across the p-n junction. The intensity of the photocurrent, or another related interferometric property, can be related to the wavelength of the received reflections, which in turn can be related to the shifted wavelength of the emitted laser light. Processing circuitry (e.g., a processor or other circuit) included in the self-mixing interferometry sensor may then be able to infer the distance or motion values of the object.

Various embodiments described below describe structures or configurations of the one or more VCSEL diodes and RCPDs that are parts of such self-mixing interferometry sensors. A VCSEL diode and an RCPD may be formed from a common set of semiconductor layers that are formed epitaxially from a common substrate, and then electrically separated by an etched trench. Alternative methods of forming the common set of semiconductor layers may be used in addition to or instead of epitaxial growth. For simplicity of explanation, hereinafter the deposition or growth of the common set of semiconductor layers will be described as formed epitaxially, but one skilled in the art will recognize that alternative methods are within the scope of this disclosure. The RCPD is then laterally adjacent to the VCSEL diode. In some embodiments the self-mixing interferometry sensor may include two VCSEL diodes, both formed from a common set of semiconductor layers, with the first VCSEL diode operable to emit the laser light and the second reverse biased and having a vertically adjacent RCPD on top to receive reflections of the emitted laser light. In this configuration, further embodiments may include a tunnel junction within the first VCSEL diode.

Additional and/or alternative embodiments may make use of another configuration, in which a VCSEL diode is epitaxially formed on an RCPD. Some of the laser light of the VCSEL diode is also emitted into the RCPD and direct measurements are made of one or more interferometric properties, either of the VCSEL diode or of the RCPD.

These and other embodiments are described below with reference to FIGS. 1A-10. However, those skilled in the art will readily appreciate that the detailed description given herein with respect to these Figures is for explanatory purposes only and should not be construed as limiting.

Figure 1B:
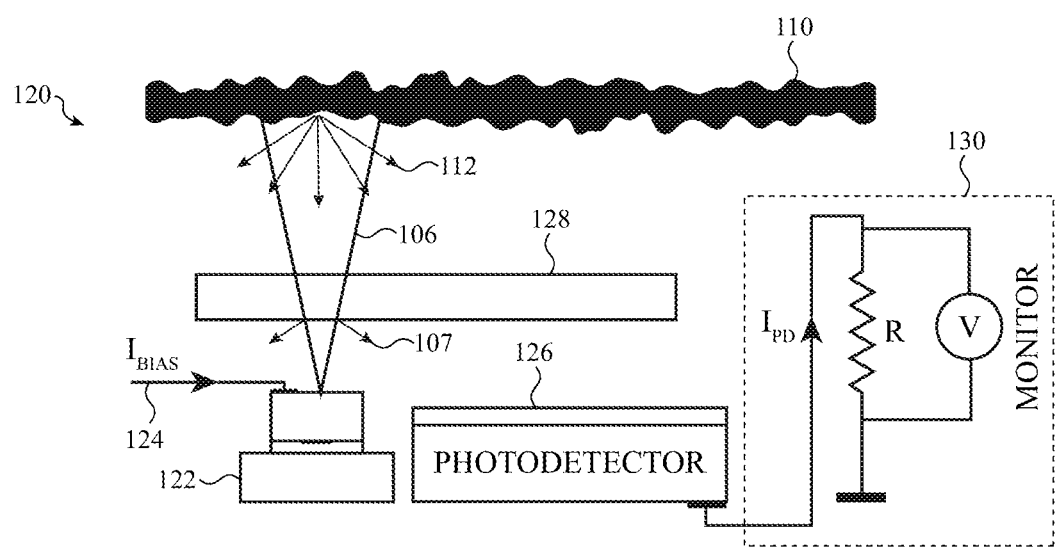
FIG. 1B illustrates a second configuration using a VCSEL diode and an associated photodetector (PD) for sensing an object, according to an embodiment.
Figure 1C:
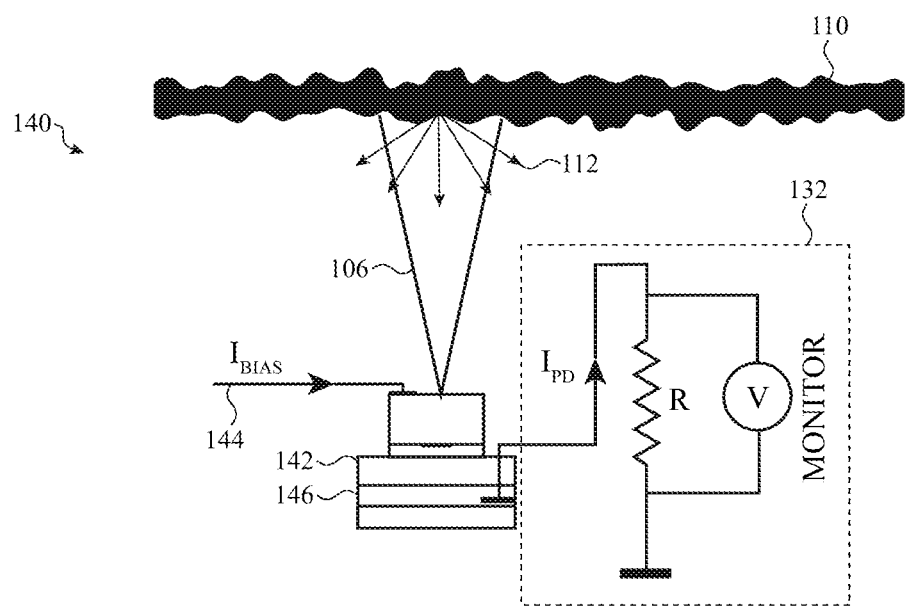
FIG. 1C illustrates a third configuration using a VCSEL diode and a vertically integrated PD for sensing an object, according to an embodiment.

FIGS. 1A-1C illustrate exemplary configurations in which a VCSEL diode can be used within a self-mixing interferometry sensor to detect displacement or motion of an object, such as may be caused by a user's touch or force input. The three configurations illustrate ways in which self-mixing interference can be caused in a VCSEL diode, and ways such self-mixing interference can be monitored.

FIG. 1A illustrates a configuration 100 for a self-mixing interferometry sensor that makes use of a VCSEL diode 102 configured to emit laser light 106, which may be directed toward an object 110. The VCSEL diode 102 may emit the laser light 106 under a forward voltage bias (or just "forward bias") of its diode structure. During such forward bias, a bias current $I_{BIAS}$ 104, flows through the VCSEL diode 102. Charge carriers crossing the p-n junction of the VCSEL diode 102 may induce laser light emission from the VCSEL diode 102.

There may be reflections 112 of the emitted laser light 106, which may travel in multiple directions from the object 110. Some of the reflections 112 may be received back into a lasing cavity of the VCSEL diode 102, causing it to undergo self-mixing interference and altering a property of the emitted laser light 106 or of an electrical property of the VCSEL diode 102 itself. For example, a voltage monitor 108 may detect changes in a junction voltage of the VCSEL diode 102 that correlate with a distance or motion of the object 110.

FIG. 1B illustrates a configuration 120 for an input or object detection sensor that uses a VCSEL diode 122. Under a forward voltage bias, the VCSEL diode 122 emits the laser light 106 through an intervening glass layer 128 toward the object 110. The glass layer 128 may cause some reflections 107 of the emitted laser light 106. The forward voltage bias induces a bias current $I_{BIAS}$ 124 to flow through the VCSEL diode 122. There may be reflections 112 of the emitted laser light 106 from an object or target, some of which may be received back into a lasing cavity of the VCSEL diode 122, causing it to undergo self-mixing interference and altering a property of the emitted laser light 106. The reflections 107 from the glass layer 128 may also affect how the VCSEL diode 122 undergoes self-mixing interference. Nevertheless, if the object is at least a certain minimum distance from the glass layer 128, a spectral analysis of an electrical signal correlated with the self-mixing interference may allow separation of first effects in the electrical signal due to the self-mixing interference caused by the reflections 107 off the glass layer 128 from second effects due to the self-mixing interference caused by the reflections 112 off the object. In some embodiments, a separation of at least 100 μm between the object and the glass layer 128 suffices.

The configuration 120 may include a photodetector (PD) 126 that may operate to receive some of the reflections 112 from the object 110. The alteration in the emitted laser light 106 may in turn alter an electrical property of the PD 126, which may be detectable. For example, an alteration in a bias current $I_{PD}$ of the PD 126 may be detected by a current monitor 130.

FIG. 1C illustrates a configuration 140 for a self-mixing interferometry sensor that uses a VCSEL diode 142. Under a forward voltage bias, the VCSEL diode 142 may emit the laser light 106 toward the object 110. The forward voltage bias induces a bias current $I_{BIAS}$ 144, to flow through the VCSEL diode 142.

Some of the reflections 112 of the emitted laser light 106 may be received within the VCSEL diode 142, causing it to undergo self-mixing interference and altering a property of the emitted laser light 106. The VCSEL diode 142 may include an integrated PD 146. The PD 146 may detect an operational change in the VCSEL diode 142 due to the self-mixing interference. For example, the VCSEL diode 142 may also emit some laser light downwards into the PD 146. Any alterations in the emitted laser light 106 due to self-mixing interference may also occur in the downward emitted laser light, and cause an operational change in the PD 146. For example, a bias current $I_{PD}$ of the PD 146 may be detected by a current monitor 132.

Figure 2A:
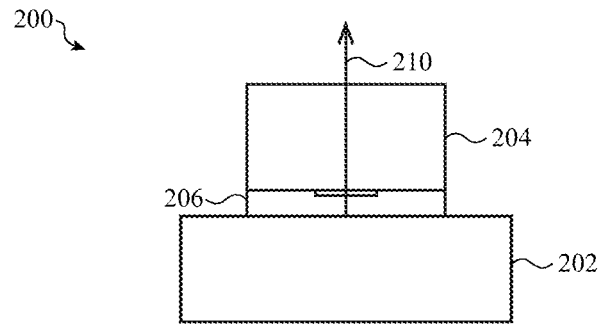
FIG. 2A illustrates exemplary components of a laser diode, according to an embodiment.
Figure 2B:
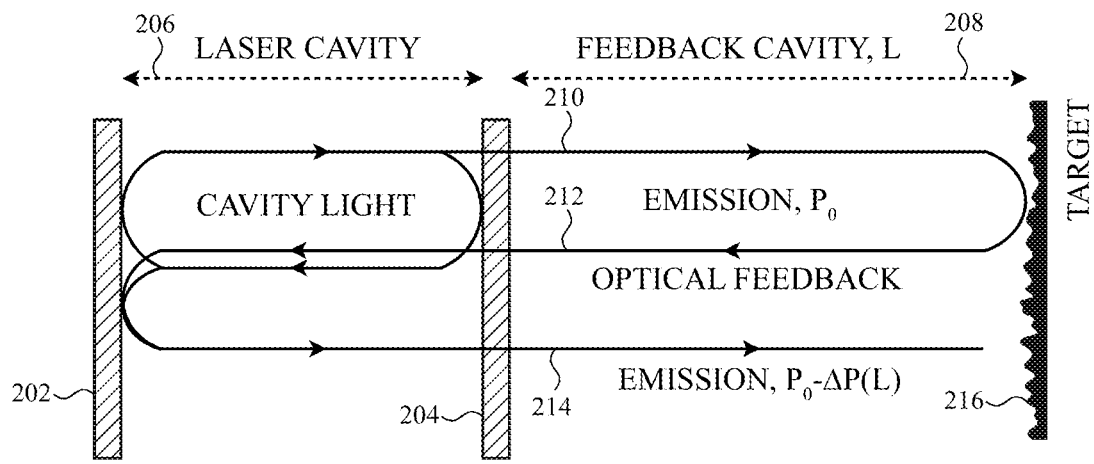
FIG. 2B illustrates self-mixing interference within a laser, according to an embodiment.
Figure 2C:
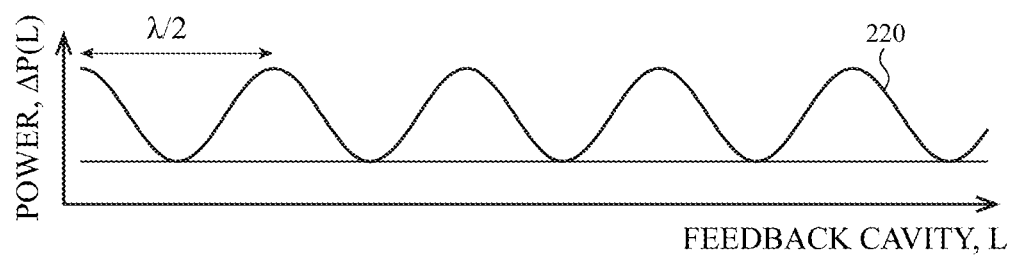
FIG. 2C is a graph of variation in power of laser light from a laser diode undergoing self-mixing interference with respect to length of a feedback cavity, according to an embodiment.

FIGS. 2A-2C illustrate properties of self-mixing interference of emitted laser light in a laser diode. The explanations are intended only to describe certain aspects of self-mixing interference needed to understand the disclosed embodiments. Other aspects of self-mixing interference will be clear to one skilled in the art.

FIG. 2A illustrates an exemplary configuration of a laser diode 200, such as any of the VCSEL diodes 102, 122, and 142 described above, that may be used as part of a self-mixing interferometry sensor. In any type of laser, an input energy source causes a gain material within a cavity to emit light. Mirrors 202 and 204 on opposite ends of the cavity feed the light back into the gain material to cause amplification of the light and to cause the light to become coherent and (mostly) have a single wavelength. An aperture in one of the mirrors allows transmission of the laser light (e.g., transmission toward an object or input surface).

In the laser diode 200, there are two mirrors 202 and 204 on opposite ends of the cavity. The lasing occurs within the cavity 206. In the case of VCSEL diodes, the two mirrors 202 and 204 may be implemented as distributed Bragg reflectors, which are alternating layers with high and low refractive indices. The cavity 206 contains a gain material, which may include multiple doped layers of III-V semiconductors. Specific details of the semiconductor materials will be presented below for the various embodiments. The emitted laser light 210 can be emitted through the topmost layer or surface of the laser diode 200. In some VCSEL diodes, the coherent light may also be emitted through the bottom layer.

FIG. 2B shows a functional diagram of self-mixing interference (or also "optical feedback") within a laser. In FIG. 2B, the cavity 206 is shown reoriented so that the emitted laser light 210 is emitted from the cavity 206 to the right. The cavity 206 has a fixed length established at manufacture. The emitted laser light 210 travels away from the cavity 206 until it intersects or impinges on an input surface or another object, such as the object 110 described above in relation to FIGS. 1A-1C. The gap of distance L from the emission point through the mirror 204 of the emitted laser light 210 to the target 216 is termed the feedback cavity 208. The length L of the feedback cavity 208 is variable as the target 216 can move with respect to the laser diode 200.

The emitted laser light 210 is reflected back into the cavity 206 by the target 216. The reflected light 212 enters the cavity 206 to coherently interact with the original emitted laser light 210. This results in a new state illustrated with the new emitted laser light 214. The new emitted laser light 214 at the new state may have characteristics (e.g., a wavelength or power) that differ from what the emitted laser light 210 would have in the absence of reflection and self-mixing interference.

FIG. 2C is a graph 220 showing the variation in power of the new emitted laser light 214 as a function of the length L of the feedback cavity 208, i.e., the distance from the emission point through the mirror 204 of the emitted laser light 210 to the target 216. The graph depicts a predominantly sinusoidal variation with a period of $\lambda/2$. Theoretical considerations imply that the variation is given by the proportionality relationship: $\Delta \propto \cos(4\pi L/\lambda)$. This relationship generally holds in the absence of a strong specular reflection. In the case of such strong specular reflection, the cosine becomes distorted, i.e., higher harmonics are present in the relationship. However, the peak-to-peak separation stays at $\lambda/2$. For an initially stationary target 216, this relationship can be used to determine that a deflection has occurred. In conjunction with other techniques, such as counting of the completed number of periods, the range of the deflection may also be determined.

Though the graph 220 shows the variation in power of the new emitted laser light 214 as a function of the length L of the feedback cavity 208, similar results and/or graphs may hold for other interferometric properties of a VCSEL diode or other type of laser diode that are measured by a self-mixing interferometry sensor. Measurements of one or more such interferometric parameters by a self-mixing interferometry sensor can be used to infer displacements or motions of the target 216 from the laser diode 200.

Figure 3A:
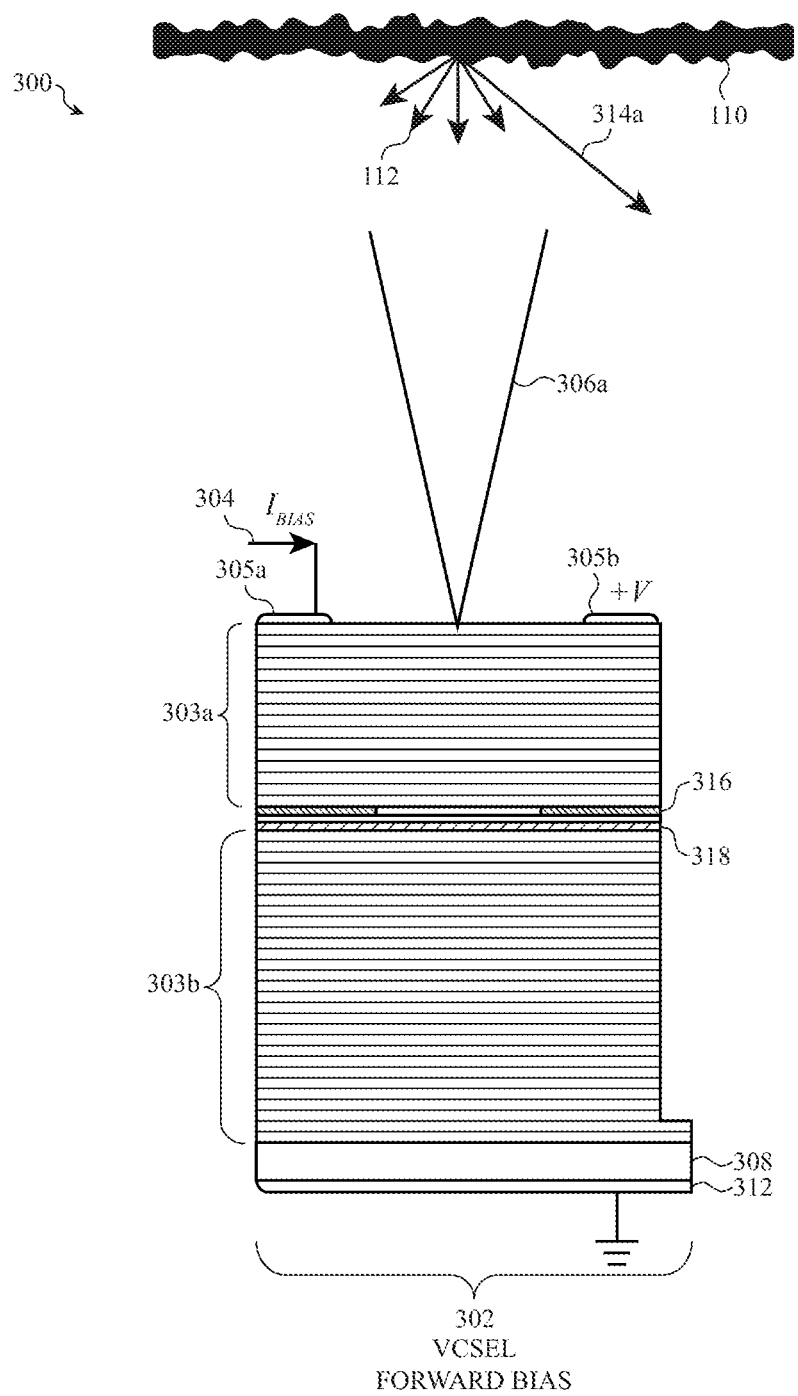
FIG. 3A illustrates a structure of a VCSEL diode, according to an embodiment.
Figure 3B:
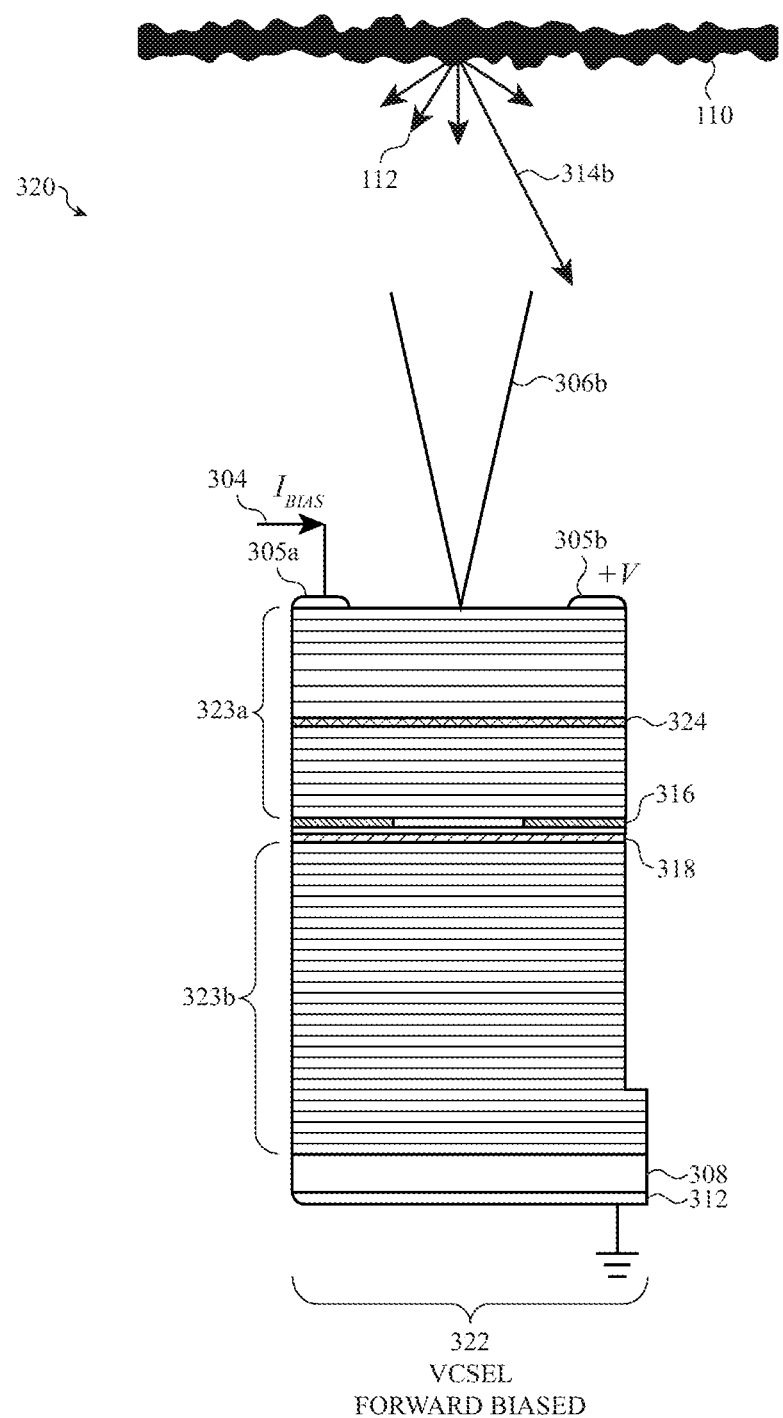
FIG. 3B illustrates a structure of another VCSEL diode, according to an embodiment.

Further details of structures for VCSEL diodes will now be presented in relation to FIGS. 3A-3B.

FIGS. 3A-3B show two exemplary configurations of the structure and operations of VCSEL diodes. Embodiments to be described below may make use of these structures, or variations thereof. One skilled in the art will recognize that other configurations and variations are within the scope of this disclosure.

FIG. 3A illustrates a first configuration 300 for a VCSEL diode 302 under forward bias and emitting a laser light 306a toward the object 110. Under the forward bias, a bias current 304, $I_{BIAS}$, flows into the VCSEL diode 302, with some or all of it returning to a ground layer or contact 312.

As previously described, some reflections 112 of the emitted laser light 306a may be received back into the VCSEL diode 302 to induce self-mixing interference. Some of the reflections 112 may also become reflected light 314a directed toward a photodetector (not shown), as described above in relation to FIG. 1B.

VCSEL diode 302 may include an emission side (or "top side") distributed Bragg reflector 303a that functions as a first (or "emission side") mirror of a laser structure. The emission side distributed Bragg reflector 303a may include a set of pairs of alternating materials having different refractive indices. Each such pair of alternating materials will be termed herein a Bragg pair. One or more of the materials in the emission side distributed Bragg reflector 303a are doped to be p-type and so form a part of the anode section of a p-n diode junction. An exemplary pair of materials that may be used to form the emission side distributed Bragg reflector 303a are aluminum gallium arsenide (AlGaAs) and gallium arsenide (GaAs).

VCSEL diode 302 may include a base side distributed Bragg reflector 303b that functions as a second (or "base side") mirror of a laser. The base side distributed Bragg reflector 303b may also include a set of Bragg pairs of alternating materials having different refractive indices. One or more of the materials in the base side distributed Bragg reflector 303b are doped to be n-type and so form a part of the anode section of a p-n diode structure. An exemplary pair of materials that may be used to form the base side distributed Bragg reflector 303b are aluminum arsenide and GaAs.

VCSEL diode 302 may include an active region layer 318 that functions in part as the lasing cavity. In laser diodes, such as VCSEL diode 302, an active region layer may include one or more quantum wells. The active region layer 318 of VCSEL diode 302 may be adjacent to an oxide layer 316, having an aperture through which escapes the emitted laser light 306a.

The VCSEL diode 302 may be formed by epitaxial growth of the layers for each of the emission side and base side distributed Bragg reflectors 303a, 303b, the active region layer 318 and the oxide layer 316, and possibly other layers. These various layers may be formed by epitaxial growth on a substrate layer 308, with the ground layer or contact 312 formed afterwards. Electrical supply contacts 305a, 305b may be formed on the outermost (i.e., emission side) layer of the VCSEL diode 302. While shown as separated in FIG. 3A, the electrical supply contacts 305a, 305b may be connected, such as to form, for example, a ring or horseshoe connection on the top side of the VCSEL diode 302.

The VCSEL diode 302 may alternatively be formed by epitaxial growth from a substrate starting with the layers for the emission side distributed Bragg reflector 303a. The substrate may then be separated from a substrate, such as by etching or cleaving, and a flip chip process used to attach the VCSEL diode 302 to another substrate or circuit, so that the emission side distributed Bragg reflector 303a is configured to emit laser light 306a.

FIG. 3B illustrates a second configuration 320 for a VCSEL diode 322 under forward bias and emitting a laser light 306b toward the object 110. Some reflections 112 of the emitted laser light 306b may be received back into the VCSEL diode 322 to induce self-mixing interference. Still others of the reflections 112 may also become reflected light 314b directed along a direction toward a photodetector (not shown), as described above in relation to FIG. 1B.

The configuration 320 for VCSEL diode 322 has many features in common with the configuration 300 for VCSEL diode 302, such as having multiple semiconductor layers extending from substrate layer 308, to which is attached a ground layer or contact 312. Also as described for VCSEL diode 302 are electrical supply contacts 305a, 305b, which may be formed on the outermost (i.e., emission side) layer of the VCSEL diode 322, and which may be as described as for the configuration 300. The VCSEL diode 322 may also include an active region layer 318 and an oxide layer 316, which may be as described as for the configuration 300. The VCSEL diode 322 may include a base distributed Bragg reflector 323b, which may as described above in regard to the base side distributed Bragg reflector 303b.

The VCSEL diode 322 may include an emission side (or "top side") distributed Bragg reflector 323a that differs from that of VCSEL diode 302. The emission side distributed Bragg reflector 323a may include a layer that serves as an etch stop layer during manufacture. One skilled in the art will recognize that various materials may serve as an etch stop layer. One such material is indium gallium phosphide (InGaP), which may have a composition of the form $In_xGa_{1-x}P$ (for $0 \leq x \leq 1$). The etch stop layer can enable a wet chemical etching to be stopped at the etch stop layer, due to a significant difference of etching rates between the etch stop layer and GaAs/AlGaAs layers. After stopping at the etch stop layer, a different chemical solution can be used to remove only the etch stop layer without significantly etching off the underlying GaAs or AlGaAs layer. By using this method, the etch stop layer may be inserted anywhere in the epitaxy layer stack as an etch stop layer so that etching can be stopped at the layer underneath the etch stop layer, and an intra-cavity contact put on that layer. One skilled in the art will see that such an etch stop layer can be InGaP or another material, as long as its etching rate under certain chemical solutions is significantly different from the layer (such as GaAs and/or AlGaAs layer) at which to stop.

In some embodiments, the VCSEL diodes 302 and 322 may be configured to emit respective laser light 306a and 306b at a natural wavelength of approximately 940 nanometers (nm), the natural wavelength being the wavelength of the respective emitted laser light 306a, 306b when there is no alteration due to self-mixing interference caused by reflections of the respective emitted laser light 306a, 306b. In other embodiments, the natural wavelength may be 850 nm, 1060 nm, or another natural wavelength. Hereinafter, for simplicity of explanation only, embodiments with VCSELs having a natural wavelength of 940 nm will be discussed. One skilled in the art will recognize that the embodiments may be implemented with a VCSEL having another natural wavelength. The natural wavelength may be varied within a range about 940 nm due to a deliberately applied modulation of $I_{BIAS}$ about a constant (DC) value. For example, in some embodiments, a triangle or a sinusoidal modulation may be applied to $I_{BIAS}$. Such biasing may be applied by self-mixing interferometry sensors as part of determining a displacement or motion of the object 110. As one example, the amplitude of such a modulation of $I_{BIAS}$ may be on the order of 1 mA, and cause a self-mixing interference shift in wavelength on the order of 0.5 nm from the natural wavelength of 940 nm. In other embodiments, the VCSEL diodes 302 and 322 may be configured to emit respective laser light 306a and 306b at a different natural wavelength, and use a different modulation amplitude to produce a different self-mixing interference wavelength shift from the natural wavelength.

The particular configurations 300 and 320 are exemplary; variations within the scope of this disclosure will be recognized by one skilled in the art. The structures of the VCSEL diodes 302 and 322, and their variations, may be part of the self-mixing interferometry sensors now to be described.

Figure 4:
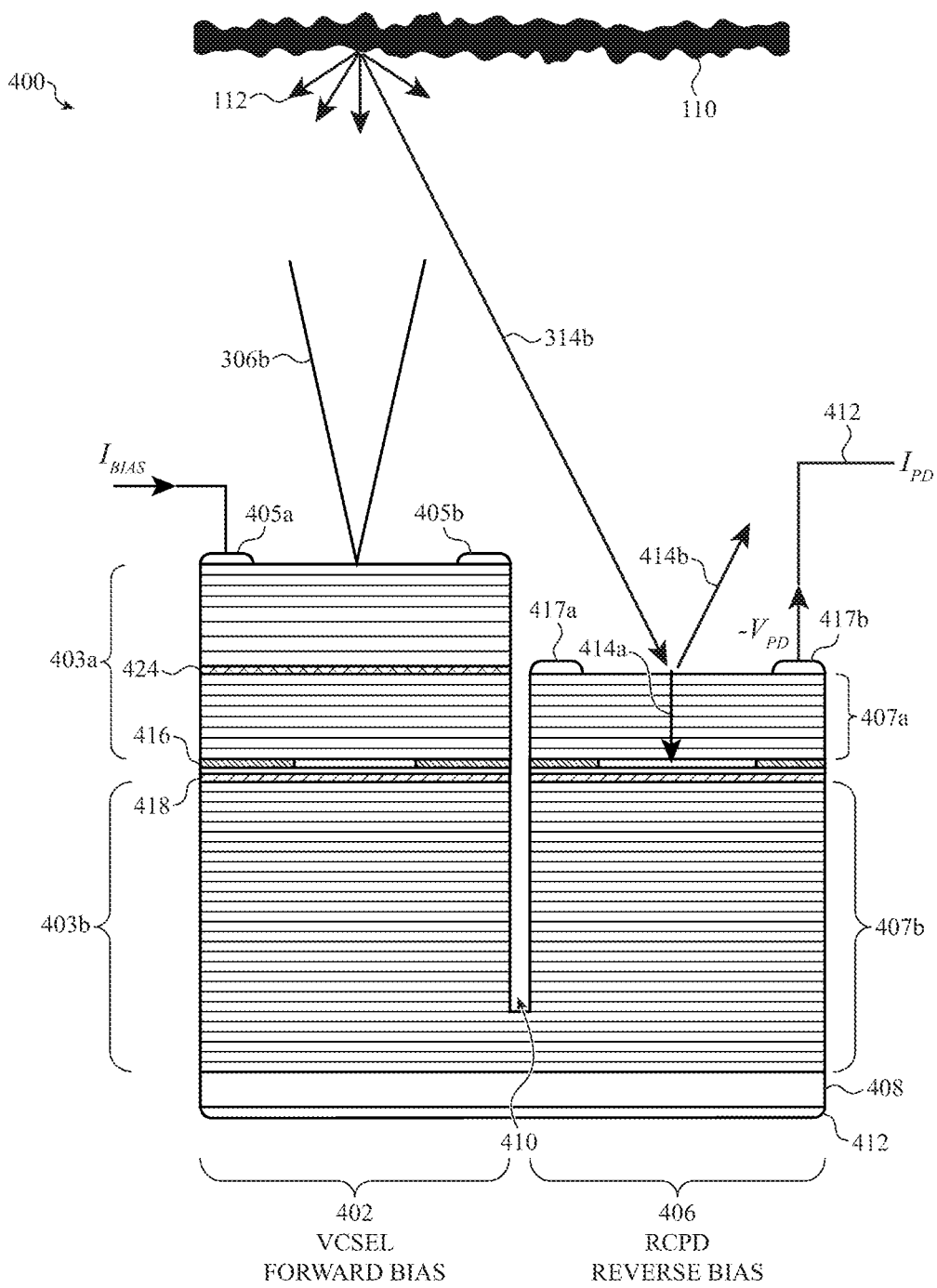
FIG. 4 illustrates a configuration of components of a self-mixing interferometry (SMI) sensor, according to an embodiment.

FIG. 4 illustrates an embodiment of at least a part of configuration 400 of a self-mixing interferometry sensor. The self-mixing interferometry sensor may include at least two components: a VCSEL 402 operable to emit laser light 306b toward an object 110 when forward biased, and a resonant cavity photodetector (RCPD) 406 that may operate to detect the reflected light 314b of all the reflections 112 of the emitted laser light 306b. Some of the reflections 112 of the emitted laser light 306b may be received back into the VCSEL 402 and cause self-mixing interference that alters, for example, the wavelength of the emitted laser light 306b.

In the embodiments shown in FIG. 4, the VCSEL diode 402 has the configuration of the VCSEL diode 322 of FIG. 3B. However, the VCSEL diode 402 may have another configuration, such as that of VCSEL diode 302 of FIG. 3A. In the particular embodiment of FIG. 4, the VCSEL diode 402 may include a base side distributed Bragg reflector 403b, an emission side distributed Bragg reflector 403a that includes an etch stop layer 424, which may be InGaP, an active region layer 418, and an oxide layer 416.

The embodiment shown in FIG. 4 may include the RCPD 406 positioned laterally adjacent to the VCSEL diode 402. The VCSEL diode 402 and the RCPD 406 are both positioned on a common substrate 408. The common substrate 408 may include a ground contact or layer 412. Further details concerning the structures and fabrication of the VCSEL diode 402 and the RCPD 406 will be presented below.

In the embodiment of FIG. 4, the RCPD 406 has a structure similar to that of the VCSEL diode 302 of FIG. 3A. In particular, the RCPD 406 may include an n-type doped base side distributed Bragg reflector 407b. The active region layer 418 and the oxide layer 416 extend into the RCPD 406, as explained further below. The RCPD 406 may also include a p-type doped top side distributed Bragg reflector 407a, so that the RCPD 406 forms a p-n junction. In the embodiment of FIG. 4, the emission side distributed Bragg reflector 407a has fewer layers than the emission side distributed Bragg reflector 403a of the VCSEL diode 402.

Each of the VCSEL diode 402 and the laterally adjacent RCPD 406 have respective electrical supply contacts. For the VCSEL diode 402, the electrical supply contacts 405a and 405b are assumed to be electrically connected, and are attached to the topmost (farthest from the common substrate 408) of the semiconductor layers forming the VCSEL diode 402. A forward bias voltage +$V_{BIAS}$ applied to the electrical supply contact 405b may cause a current $I_{BIAS}$ to flow through the p-n diode junction formed by the p-type emission side distributed Bragg reflector 403a and the n-type base side distributed Bragg reflector 403b, and be collected at the ground contact or layer 412. For the RCPD, the electrical supply contacts 417a and 417b are assumed to be electrically connected, and are attached to the topmost of the semiconductor layers forming the RCPD 406.

The RCPD 406 may be reverse biased during at least part of the time that VCSEL diode 402 is forward biased. The reverse bias may be applied by a negative voltage, indicated by $-V_{PD}$, applied at the electrical supply contact 417b. While reverse biased, the RCPD 406 may operate as a photodetector. While so operating, the reflected light 314b may impinge on the topmost layer of the RCPD 406, with some becoming secondary reflections 414b, and others becoming absorbed light 414a. Under the applied reverse bias, no significant current flows across the p-n junction of the RCPD 406. But the absorbed light 414a can induce charge carriers to cross the junction and produce a photocurrent $I_{PD}$. Variations in the emitted laser light 306b from the VCSEL diode 402 may produce corresponding detectable variations in the photocurrent $I_{PD}$. The self-mixing interferometry sensor may then use those detectable variations to infer displacement or motion of the object 110.

The VCSEL diode 402 and the RCPD 406 may both be formed from a common set of semiconductor layers epitaxially formed on the common substrate 408. That is, the various semiconductor layers for the base side distributed Bragg reflectors 403b and 407b, the active region layer 418, the oxide layer 416, and the layers for the emission side distributed Bragg reflectors 403a and 407a may be sequentially applied to the common substrate 408, which may be a semiconductor material or another type of substrate, such as sapphire, glass or another material.

After epitaxial formation of all the semiconductor layers, various layers at various locations may be removed, such as by etching or another process. Hereinafter, etching will denote any of the known methods of removing material from a semiconductor during fabrication. In the embodiment of FIG. 4, a trench 410 is etched through the semiconductor layers, including through the active region layer 418. In some embodiments, the trench 410 may extend through to the common substrate 408, though this is not required. The trench 410 can provide electrical separation between the VCSEL diode 402 and the RCPD 406, allowing for the alternate biasing of each.

In the embodiment of FIG. 4, some of the semiconductor layers for the emission side distributed Bragg reflector 403a, such as the etch stop layer 424 and above, are initially epitaxially formed at the location of the RCPD 406 as well, but then removed by etching. A first purpose for removing those semiconductor layers is to provide higher absorption of the reflected light 314b. A second purpose is to allow for a wider angle of acceptance of the reflected light 314b: absorbed light 414a may enter the RCPD 406 at a larger angle from the normal and still pass into the active region layer. Other advantages are also possible.

One skilled in the art will recognize that the VCSEL diode 402 and associated RCPD 406 shown in FIG. 4, as well as the various VCSEL diodes and RCPDs illustrated in each of the embodiments disclosed herein, may be a section of an array of such elements used within a self-mixing interferometry sensor. The epitaxial formation of the common set of semiconductor layers may allow for more efficient formation of such an array.

In some embodiments, during formation of a particular layer of the common set of semiconductor layers, techniques such as masking and doping may be used to alter a doping or chemical composition of a certain layer. For example, during epitaxial formation of the active region layer 418, its doping type or chemical composition may be altered at the location of the RCPD 406. This may allow for an improved detection of the absorbed light 414a.

Figure 5A:
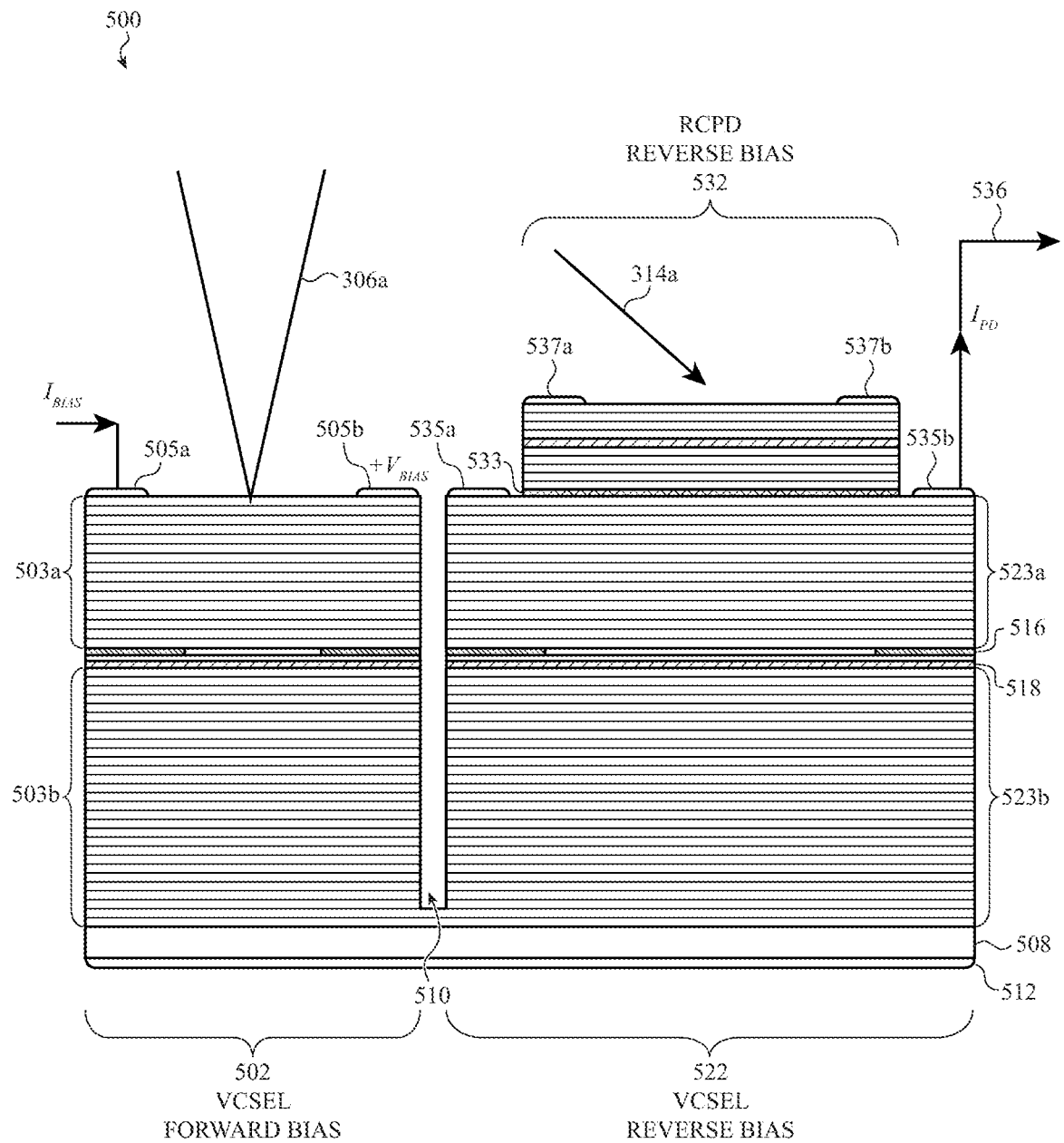
FIG. 5A illustrates another configuration of components of a SMI sensor, according to an embodiment.
Figure 5B:
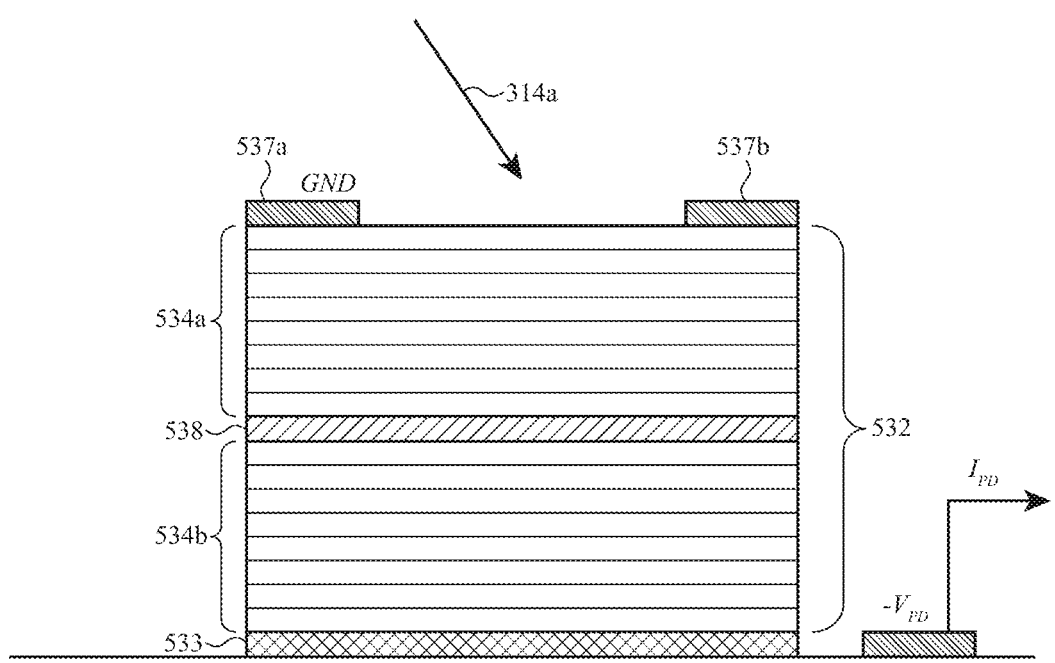
FIG. 5B illustrates a configuration of components of a resonant cavity photodetector, according to an embodiment.

FIGS. 5A-5B illustrate certain details of a configuration for a self-mixing interferometry sensor 500. The self-mixing interferometry sensor may include a first VCSEL diode 502, a similarly structured, laterally adjacent second VCSEL diode 522, formed on a common substrate 508, and a resonant cavity photodetector (RCPD) 532 vertically adjacent to the second VCSEL diode 522. A ground contact or layer 512 may be attached to a side of the common substrate 508 opposite to the first VCSEL diode 502.

The first VCSEL diode 502 may be structured similarly to the VCSEL diode 302 of FIG. 3A. In the embodiment of FIG. 5A, the first VCSEL diode 502 may include a base side distributed Bragg reflector 503b, which may be as those described previously. The first VCSEL diode 502 may include an active region layer 518, and an oxide layer 516 above it (i.e., on a side of the active region layer 518 opposite to the common substrate 508). The first VCSEL diode 502 may include an emission side distributed Bragg reflector 503a, which may be as those described previously. Electrical supply contacts 505a and 505b, which may be connected are attached to the emission side of the first VCSEL diode 502. As previously described, the emission side distributed Bragg reflector 503a may have p-type doping, and the base side distributed Bragg reflector 503b may have n-type doping to form a diode p-n junction structure.

A forward voltage bias, shown as +$V_{BIAS}$, may be applied at the electrical supply contact 505b. With a forward voltage bias to the first VCSEL diode 502, a bias current $I_{BIAS}$ will flow through the p-n junction and be received at the ground contact or layer 512. During an applied forward bias, the first VCSEL diode may emit laser light 306a, such as toward an object (not shown), such as object 110 previously described.

The second VCSEL diode 522 may be similarly structured to the first VCSEL diode 502, such as by formation from a common set of semiconductor layers, as described below. In the embodiment of FIGS. 5A-5B, the second VCSEL diode 522 may include a base side distributed Bragg reflector 523b, a separated extension of the active region layer 518, a separated extension of the oxide layer 516, and an emission side distributed Bragg reflector 523a. Electrical supply contacts 535a and 535b, which may be connected, are connected to a semiconductor layer parallel to the topmost (emission side) semiconductor layer of first VCSEL diode 502.

The self-mixing interferometry sensor 500 may include RCPD 532 formed on the emission side distributed Bragg reflector 503a of the second VCSEL diode 522. An etch stop layer 533, which may be InGaP, may be between the RCPD 532 and the second VCSEL diode 522. During at least part of the time in which the first VCSEL diode 502 is forward biased to emit laser light 306a, the second VCSEL diode 522 may be reverse biased by applying a negative voltage at the electrical supply contacts 535a, 535b. This can reduce undesired contributions to the photodetector current $I_{PD}$ 536, as will now be explained in relation to FIG. 5B.

FIG. 5B illustrates further details of the RCPD 532. The RCPD 532 may be structured similar to a VCSEL diode. In the embodiment of FIG. 5B, the RCPD 532 may include a base side distributed Bragg reflector 534b, a photodetector active region layer 538, and an emission side distributed Bragg reflector 534a. The base side distributed Bragg reflector 534b may have p-type doping, and the emission side distributed Bragg reflector 534a may have n-type doping to form a diode p-n junction.

The RCPD 532 has electrical supply contacts 537a and 537b on the topmost layer of its emission side distributed Bragg reflector 534a. The electrical supply contacts 537a and 537b may be connected, such as by being parts of the same electrical supply contact, as explained previously.

During times when the first VCSEL diode 502 is forward biased to emit laser light 306a, the second VCSEL diode 522 may be reverse biased by a negative voltage $-V_{PD}$ being applied to the electrical supply contacts 535a and 535b. The RCPD 532 may also be reverse biased by setting the electrical supply contacts 537a and 537b to ground (0V). When reflected light 314a impinges on the RCPD 532, some may be absorbed and cause changes to the photodetector current $I_{PD}$. These changes to the photodetector current $I_{PD}$ may correlate with alterations in the reflected light 314a caused by self-mixing interference occurring in the first VCSEL diode 502. Processing circuitry (not shown) may measure these changes to the photodetector current $I_{PD}$ and infer displacement or motion of the object causing the reflected light 314a, as described previously.

In various embodiments, the number of Bragg pairs in the emission side distributed Bragg reflector 534a is less than the number of Bragg pairs in the base side distributed Bragg reflector 523b. This may provide the RCPD 532 with an increased acceptance angle for the reflected light 314a. This may lead to an improved signal-to-noise ratio, such as in $I_{PD}$. In one embodiment 4 Bragg pairs are used for the emission side distributed Bragg reflector 534a and 11 Bragg pairs are used for the base side distributed Bragg reflector 534b.

Various advantages accrue to the configuration for the self-mixing interferometry sensor 500. Under reverse bias the RCPD 532 and the second VCSEL diode 522 can be formed to act as a selective wavelength filter for the wavelength of the emitted laser light 306a. Another advantage is that the photodetector active region layer 538 may be or include InGaAs. InGaAs has a lattice structure that is not compatible with the lattice structure of AlGaAs which may be a material used as part of the distributed Bragg reflectors adjacent to the photodetector active region layer 538. Since the InGaAs in the photodetector active region layer 538 has a more limited extent than the various semiconductor layers in the first VCSEL diode 502 and the second VCSEL diode 522, there is less mechanical stress. In still another advantage, the photodetector active region layer 538 may be formed with different doping or chemical composition than that of the active region layer 518.

The configuration for the self-mixing interferometry sensor 500 may be formed as described above for the self-mixing interferometry sensor of FIG. 4. The first VCSEL diode 502 and the second VCSEL diode 522 may both be formed from a common set of semiconductor layers epitaxially formed on the common substrate 508. The further semiconductor layers for the RCPD 532 may then be epitaxially formed on those layers. Etching may then be used to form the trench 510 and to remove the further semiconductor layers added for the RCPD 532 from above the location for the first VCSEL diode 502, from above the locations for the electrical supply contacts 535a and 535b, and possibly from other desired locations.

Figure 6A:
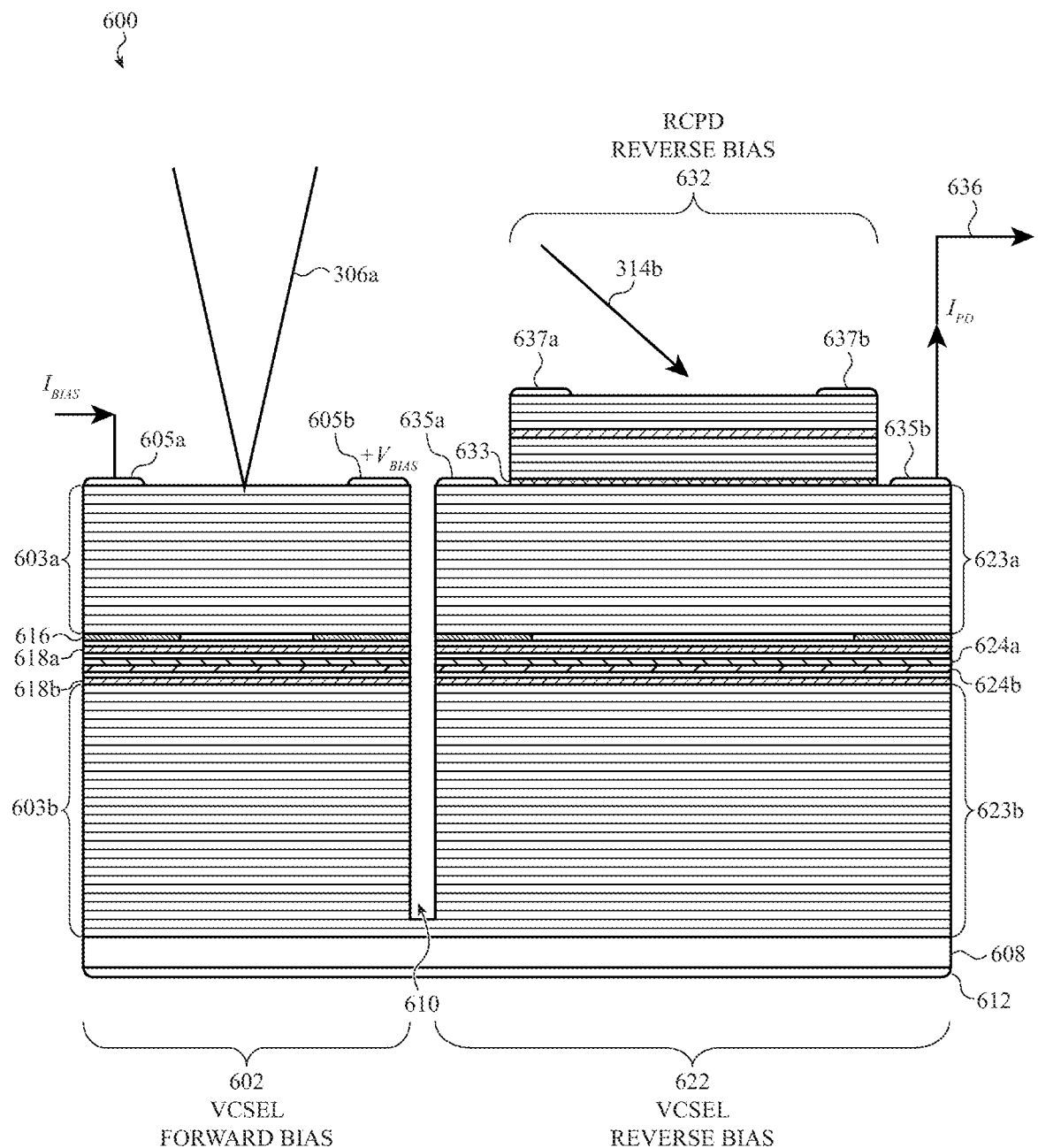
FIG. 6A illustrates another configuration of components of a SMI sensor, according to an embodiment.
Figure 6B:
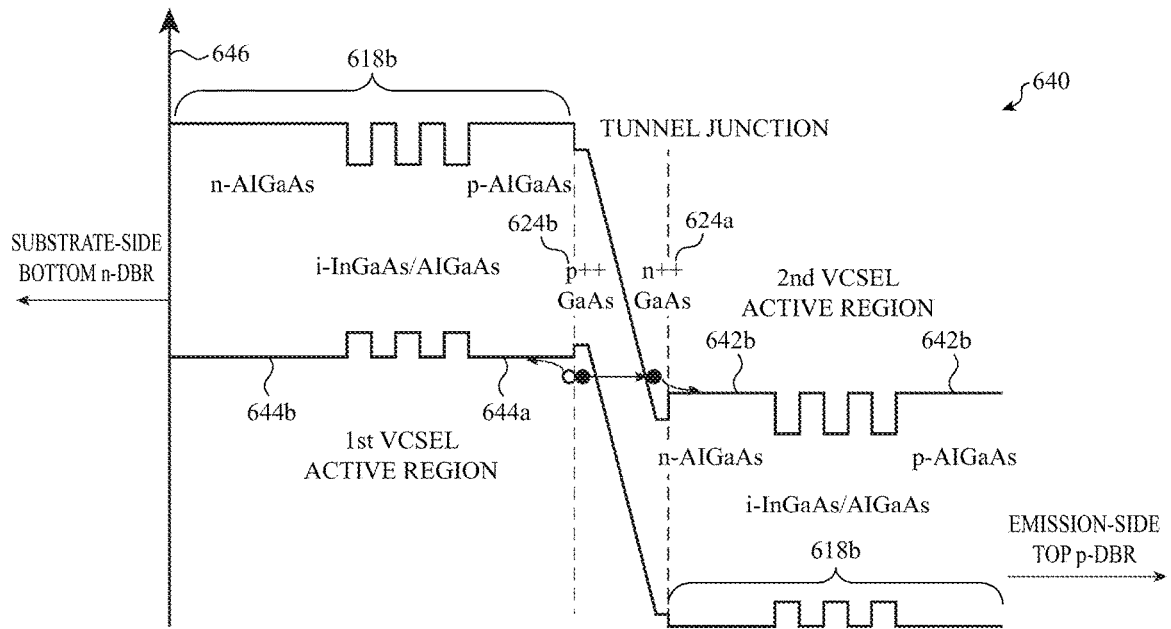
FIG. 6B illustrates an energy band diagram for two active region layers and a tunnel junction within a VCSEL diode, according to an embodiment.
Figure 6C:
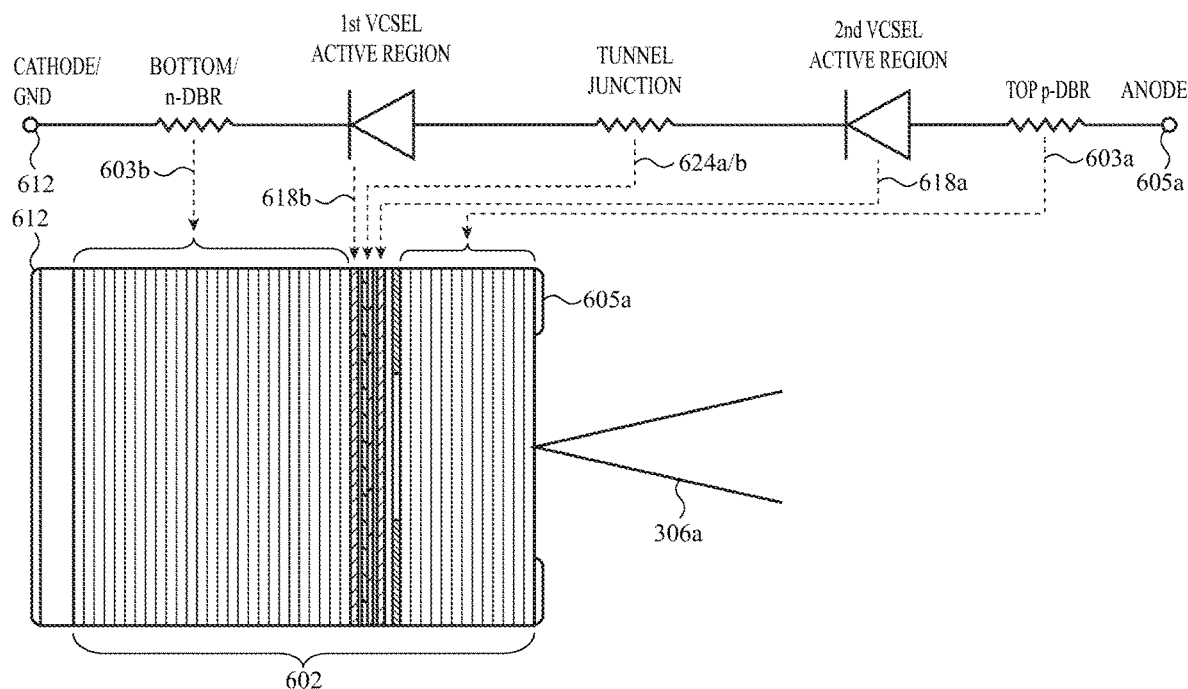
FIG. 6C illustrates an equivalent circuit for two active region layers and a tunnel junction within a VCSEL diode, according to an embodiment.

FIGS. 6A-6C illustrate variations for the embodiments illustrated in FIGS. 5A-5B. The embodiments described in relation to FIGS. 6A-6C can provide a strong feedback signal, such as measured by the signal-to-noise ratio in $I_{PD}$ as described above. The embodiments described in relation to FIGS. 6A-C are directed to reducing the internal reflectance of the emission side distributed Bragg reflector that functions as one mirror of the laser. Reducing the internal reflectance, such as by increasing the amount of emitted laser light, allows for stronger reflections from objects, and hence stronger reflections being absorbed by the associated RCPD. But a reduced internal reflectance may work against the VCSEL diode reaching the threshold for lasing. The embodiments described in relation to FIGS. 6A-6C allow for reduced reflectance of the emission side distributed Bragg reflector by decreasing the threshold for lasing. This is achieved by including a tunnel junction with or in the active region layer or layers. These considerations will now be described in detail.

FIG. 6A illustrates a configuration of a self-mixing interferometry sensor 600 similar to the configuration described for the self-mixing interferometry sensor 500. The self-mixing interferometry sensor 600 may include a first VCSEL diode 602, and a second VCSEL diode 622 laterally adjacent to the first VCSEL diode 602, with both formed from a common set of semiconductor layers on a common substrate 608. A ground layer or contact 612 is formed on a side of the common substrate 608 opposite to the first VCSEL diode 602. The self-mixing interferometry sensor 600 may also include a resonance cavity photodetector (RCPD) 632 vertically adjacent to a side of the second VCSEL diode 622 opposite to the common substrate.

The first VCSEL diode 602 may include an emission side distributed Bragg reflector 603a and a base side distributed Bragg reflector 603b. The first VCSEL diode 602 may include electrical supply contacts 605a and 605b, which may be connected, adjacent to the topmost of the common set of semiconductor layers, or on a topmost layer of the emission side distributed Bragg reflector 603a.

The first VCSEL diode 602 may contain both a first active region layer 618a and a second active region layer 618b positioned between the emission side distributed Bragg reflector 603a and the base side distributed Bragg reflector 603b, with the first active region layer 618a proximate to the emission side distributed Bragg reflector 603a. The first VCSEL diode 602 may include an oxide layer 616 between the first active region layer 618a and the emission side distributed Bragg reflector 603a. The first VCSEL diode 602 may contain a first tunnel junction layer 624a that is n-doped, and a second tunnel junction layer 624b that is p-doped. The first and second tunnel junction layers 624a, 624b are positioned between the first active region layer 618a and the second active region layer 618b. Further details of the structure and operability of the tunnel junction layers 624a, 624b will be presented below in regard to FIGS. 6B-C.

The second VCSEL diode 622 may include an emission side distributed Bragg reflector 623a and a base side distributed Bragg reflector 623b. The second VCSEL diode 622 may include electrical supply contacts 635a and 635b, which may be connected, adjacent to the topmost of the common set of semiconductor layers.

The self-mixing interferometry sensor 600 may also include a RCPD 632 formed from additional semiconductor layers adjacent to, and extending vertically from, the emission side distributed Bragg reflector 623a of the second VCSEL diode 622. The RCPD 632 may include an etch stop layer 633, which may be InGaP, adjacent to the topmost of the semiconductor layers of the emission side distributed Bragg reflector 623a. The RCPD 632 may include an active region layer 638. The RCPD 632 may include electrical supply contacts 637a and 637b, which may be connected, positioned on the topmost of the additional semiconductor layers.

The self-mixing interferometry sensor 600 may operate by applying a forward voltage bias $+V_{BIAS}$ to the electrical supply contacts 605a, 605b to induce lasing and the emission of laser light 306a. Some of the emitted laser light 306a may reflect from an object (not shown) and be received back into the first VCSEL diode 602 and induce self-mixing interference therein, which may induce a change in the emitted laser light 306a to a new wavelength. Other reflections of the emitted laser light 306a become the reflected light 314b directed toward the RCPD 632. The RCPD 632 and the second VCSEL diode 622 are reverse biased for at least part of the time that the first VCSEL diode 602 emits laser light 306a. The reverse bias may be applied as a negative voltage $-V_{PD}$ applied at the electrical supply contacts 635a, 635b. The reflected light 314b may enter the RCPD 632 and induce a photodetector current $I_{PD}$. As described previously, the photocurrent may then be an input to a processor or processing circuitry that can infer a value for the new wavelength and/or a distance or motion of the reflecting object.

The self-mixing interferometry sensor 600 may be formed as described previously. A common set of semiconductor layers for the first VCSEL diode 602 and the second VCSEL diode 622 is epitaxially formed on the common substrate 608. The additional semiconductor layers for the RCPD 632 may then be epitaxially formed on the common set of semiconductor layers. Etching may then remove any of the additional semiconductor layers formed over the location for the first VCSEL diode 602. Etching may also remove a section of the common set of semiconductor layers to form the trench 610. The trench 610 may extend through the first and second active region layers 618a, 618b.

FIG. 6B illustrates an energy band diagram 640 for the first and second VCSEL active regions 618a, 618b and the two tunnel junction layers 624a, 624b in the first VCSEL diode 602. The energy band diagram 640 shows the relative positions of the conduction band, denoted $E_c$ and the valence band, denoted $E_v$. The first tunnel junction layer 624a, which is proximate to the first active region layer 618a, may be a highly doped (e.g., doping level greater than $1 \times 10^{19}$ cm$^3$) n-type semiconductor, such as the shown highly doped n-type (n++) GaAs. The second tunnel junction layer 624b, which is proximate to the second active region layer 618b, may be a highly doped p-type semiconductor, such as the shown highly doped p-type (p++) GaAs. In other embodiments, the tunnel junction layers may use semiconductor materials other than GaAs. A non-limiting set of such semiconductor materials includes $Al_xGa_{1-x}As$ (for $0 \leq x \leq 1$), InP, $In_xGa_{1-x}As$ (for $0 \leq x \leq 1$), $In_{1-x-y}Al_xGa_yAs$ (for $0 \leq x \leq 1$, $0 \leq y \leq 1$), and $In_xGa_{1-x}As_yP_{1-y}$ (for $0 \leq x \leq 1$, $0 \leq y \leq 1$).

The first active region layer 618a may include at least three sections: a top section of p-type doped aluminum gallium arsenide (AlGaAs) 642a proximate to the emission side distributed Bragg reflector 603a, a bottom section of n-type doped aluminum gallium arsenide (AlGaAs) 642b proximate to the first tunnel junction layer 624a, and a central section of alternating pairs of intrinsic InGaAs and AlGaAs 642c forming quantum wells.

The second active region layer 618b may include at least three sections: a top section of p-type doped AlGaAs 644a proximate to the second tunnel junction layer 624b, a bottom section of n-type doped aluminum gallium arsenide (AlGaAs) 644b proximate to the base side distributed Bragg reflector 603b, and a central section of alternating pairs of intrinsic InGaAs and AlGaAs 644c forming quantum wells.

FIG. 6C illustrates an electrical circuit model 650 indicating the functionality of the various layers of the first VCSEL diode 602, which is shown horizontally for explanation purposes. The first and second tunnel junction layers 624a, 624b together operate as a resistor separating the first active region layer 618a and the second active region layer 618b. The first and second active region layers 618a, 618b each are modeled as diodes. A single active region layer, as in the embodiments of FIG. 5, may not be inadequate by itself to provide sufficient gain for lasing when the reflectance of the emission side mirror, such as emission side distributed Bragg reflector 603a, is reduced in order to produce more emitted laser light. The resistance provided by the first and second tunnel junction layers 624a, 624b allows for the first and second active region layers 618a, 618b to provide an increased total gain sufficient to produce lasing even with a reduced reflectance of the emission side mirror.

As an example, in a single conventional VCSEL diode having a single active region layer, the bottom mirror may need a reflectance with $R_B > 99.99\%$, and the top mirror may need a reflectance with $R_T > 99.3\%$. In certain of the embodiments of FIGS. 6A-C, the top reflectance, as provided by the emission side distributed Bragg reflector 603a, may be able to be reduced to satisfy just $R_T > 98.5\%$. The decrease in reflectance of the emission side distributed Bragg reflector 603a may, in some embodiments, be implemented by it having fewer Bragg pairs.

In the electrical circuit model 650, the electrical supply contact 605a functions as the anode at which a positive bias voltage is provided, and the ground layer or contact 612 functions as the cathode. In the embodiments of self-mixing interferometry sensor 600 of FIGS. 6A-C, the positive bias voltage may need to be higher to produce lasing than for embodiments in which there is only one active region layer, because there is a need to supply the diode voltage drops for both the first and second active region layers 618a, 618b. In the electrical circuit model 650, the emission side distributed Bragg reflector 603a and the base side distributed Bragg reflector 603b each function as resistors.

The embodiments of self-mixing interferometry sensors in FIG. 4, FIGS. 5A-B, and FIGS. 6A-C have a laterally adjacent RCPD designed to receive reflections of the emitted laser light that are distinct from the reflections that produce the self-mixing interference in the lasing VCSEL diode. Additional and/or alternative embodiments of self-mixing interferometry sensors described with respect to FIG. 8 and FIG. 9 make use of RCPDs that are vertically adjacent to the lasing VCSEL diode.

Figure 7A:
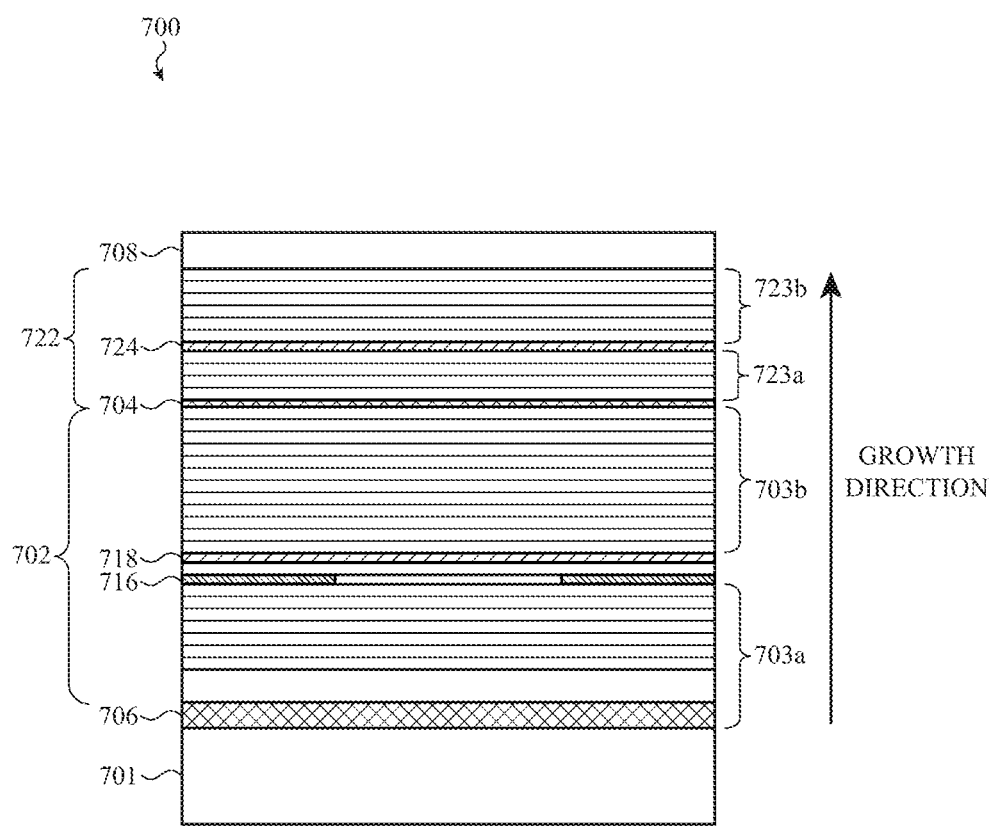
FIG. 7A illustrates a manufacturing and epitaxial grown process for a self-mixing interferometry sensor, according to an embodiment.
Figure 7B:
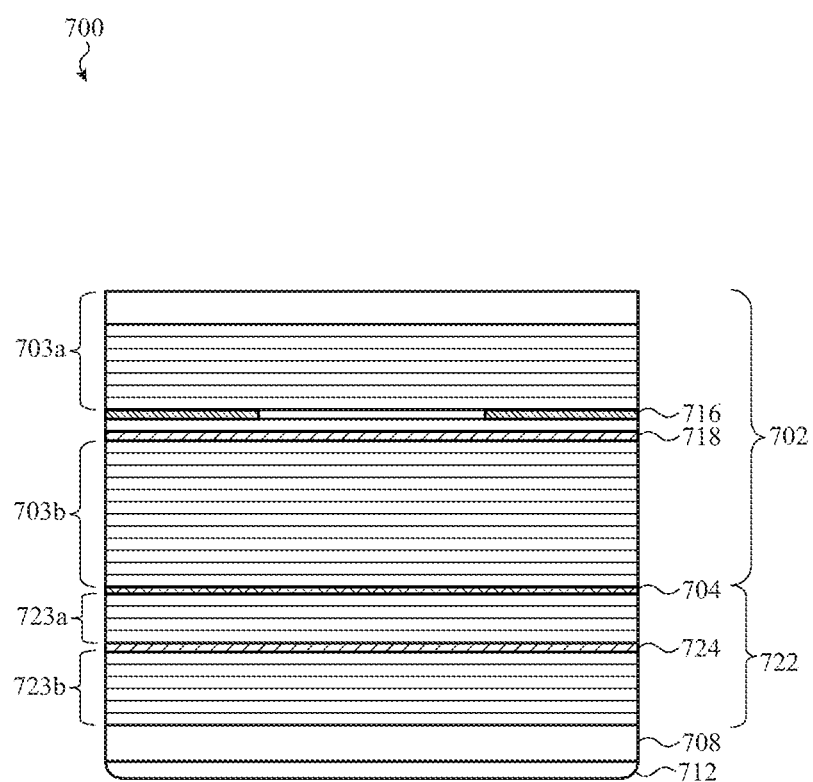
FIG. 7B illustrates a flip chip and substrate removal process for the self-mixing interferometry sensor of FIG. 7A, according to an embodiment.

FIGS. 7A and 7B illustrate a manufacturing and epitaxial growth process for a self-mixing interferometry sensor 700 as depicted and described herein. As part of the epitaxial growth for the self-mixing interferometry sensor 700, a first etch stop layer 706 (e.g., an InGaP etch stop layer) may be epitaxially formed on a substrate 701. Semiconductor layers for a VCSEL diode 702 may be epitaxially formed on the first etch stop layer 706.

A second etch stop layer 704 (e.g., an InGaP etch stop layer) may be epitaxially grown on a top portion of the semiconductor layers comprising the VCSEL diode 702. The second etch stop layer may separate semiconductor layers for the VCSEL diode 702 from semiconductor layers for the RCPD 722. As depicted in FIG. 7A, the RCPD 722 may be epitaxially formed from the second etch stop layer 704. A substrate layer 708 may be formed or otherwise placed above the semiconductor layers for the RCPD 722.

The VCSEL diode 702 may include an emission side distributed Bragg reflector 703a proximate to the first etch stop layer 706, an oxide layer 716 (e.g., a high-aluminium $Al_xGa_{1-x}As$ layer, where X is approximately equal to 0.98), an active region layer 718, and a base side distributed Bragg reflector 703b proximate to the second etch stop layer 704. In some embodiments, the active region layer 718 may be a number of forward biased quantum wells (e.g., forward biased quantum wells configured to generate light). In some embodiments, the number of quantum wells comprising the active region layer 718 may be less than six and/or may have a quantum well thickness of less than 10 nm. The base side distributed Bragg reflector 703b and the emission side distributed Bragg reflector 703a may function as previously described.

The RCPD 722 may include an emission side distributed Bragg reflector 723a, an active region layer 724, and a base side distributed Bragg reflector 723b. The emission side distributed Bragg reflector 723a and the base side distributed Bragg reflector 723b may function as previously described. The active region layer 724 may be a photon absorption layer (e.g., an InGaAs photon absorption layer). In some embodiments, the active region layer 724 has a thickness between 15 nm and 60 nm. The active region layer 724 may, in some embodiments, be formed of quantum wells. A substrate layer 708 may be grown and/or positioned above the RCPD 722 (e.g., proximate to the base side distributed Bragg reflector 723b).

FIG. 7B illustrates the self-mixing interferometry sensor 700 after a flip chip process has occurred. In FIG. 7B, the substrate 701 and the first etch stop layer 706 may have been removed during a removal process. The substrate layer 708 may be positioned proximate to a ground contact layer 712. As illustrated in FIG. 7B, the self-mixing interferometry sensor 700 may be flipped upside down (e.g., in a flip chip process) so that, for example, the VCSEL diode 702 is positioned above the RCPD 722. After the flip chip process, the self-mixing interferometry sensor 700 may undergo further substrate removal processes and may transform into the self-mixing interferometry sensor 800 depicted and described below with respect to FIG. 8.

Figure 8:
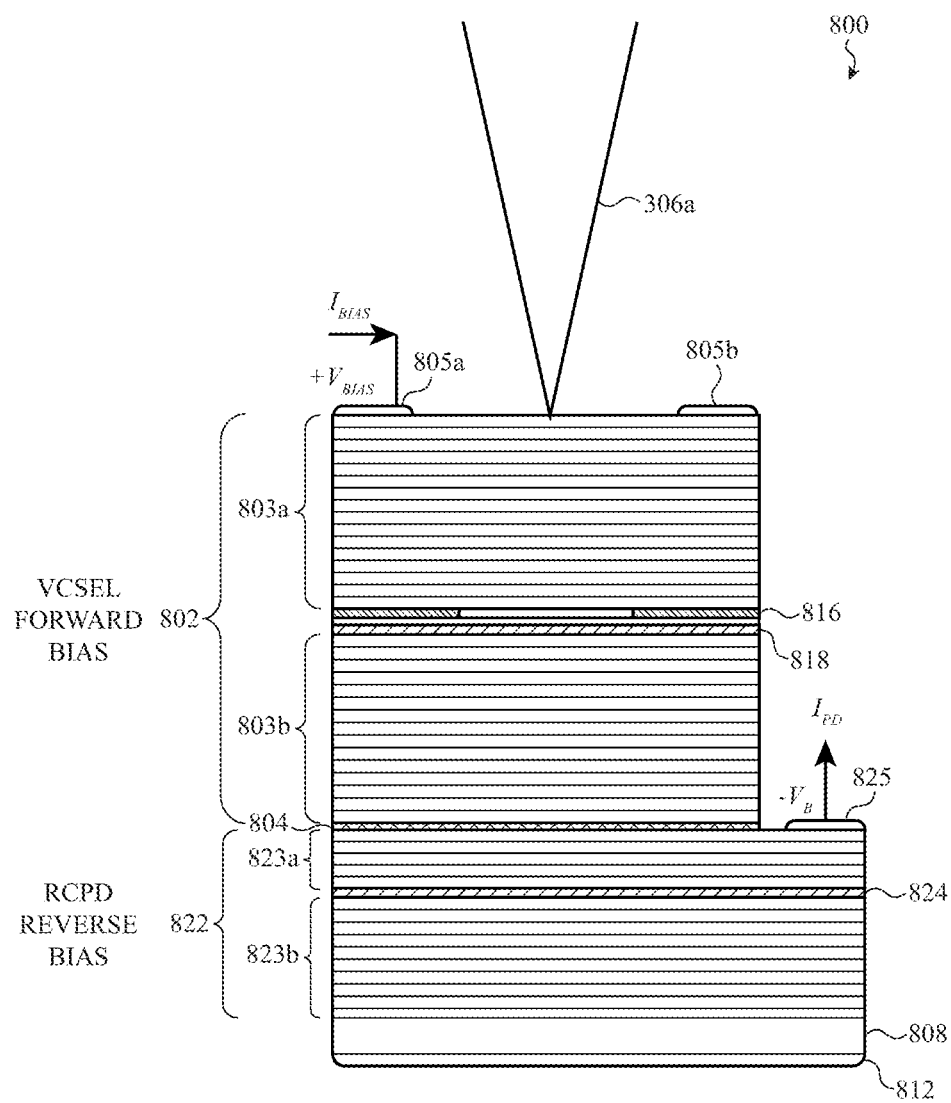
FIG. 8 illustrates a configuration of components of a self-mixing interferometry sensor, according to an embodiment.

FIG. 8 illustrates a configuration of a self-mixing interferometry sensor 800 that may include a VCSEL diode 802 vertically adjacent to RCPD 822. The self-mixing interferometry sensor 800 may be manufactured and epitaxially grown by the process described above with respect FIGS. 7A and 7B or may be epitaxially grown from the substrate layer 808 upward as described herein. The semiconductor layers for the RCPD 822 may be epitaxially formed on a substrate 808. A ground contact layer 812 may be formed in or on the substrate, such as on a side of the substrate 808 opposite to the RCPD 822.

An etch stop layer 804, which may be InGaP, may separate the semiconductor layers for the RCPD 822 from further layers forming the VCSEL diode 802. The VCSEL diode 802 may include a base side distributed Bragg reflector 803b proximate to the etch stop layer 804, an active region layer 818, an oxide layer 816, and an emission side distributed Bragg reflector 803a. The base side distributed Bragg reflector 803b and the emission side distributed Bragg reflector 803a function as described previously. Affixed to the topmost layer of the VCSEL diode 802 are electrical supply contacts 805a and 805b, which may be connected.

The RCPD 822 may itself be structured with an active region layer 824 positioned between an emission side distributed Bragg reflector 823a and a base side distributed Bragg reflector 823b. The base side distributed Bragg reflector 823b and the emission side distributed Bragg reflector 823a function as described previously. The semiconductor layers for the RCPD 822 may laterally extend beyond the semiconductor layers forming the VCSEL diode 802. Such a configuration may be formed by epitaxially forming all the layers included in the self-mixing interferometry sensor initially, and then etching part of the layers of the VCSEL diode 802. An electrical supply contact 825 is affixed to topmost layer of the RCPD at such a position that extends laterally beyond the VCSEL diode 802.

In operation, a forward voltage bias $+V_{BIAS}$ is applied to the electrical supply contacts 805a and 805b, which induces a bias current $I_{BIAS}$ to flow into the VCSEL diode 802 and induce emission of laser light 306a, as described previously. For at least part of the time that the VCSEL diode 802 is emitting laser light, the RCPD 822 may be reverse biased by the application of a negative voltage $-V_{PD}$ at the electrical supply contact 825, to cause the flow of a photodetector current $I_{PD}$. In addition to the emitted laser light 306a, some of laser light produced in the active region layer 818 may be directed downward and be absorbed or received in the reverse biased RCPD 822.

If some of the emitted laser light 306a is reflected from an object (not shown) and is received in the VCSEL diode 802, self-mixing interference may occur that induces an alteration in the wavelength of the emitted laser light 306a. Some of such altered laser light may then be received in the RCPD 822, producing a measurable change in the photodetector current $I_{PD}$, or another electrical or interferometric property of the RCPD 822. Such a measurable change may be used to infer a distance or a motion of the reflecting object.

Figure 9:
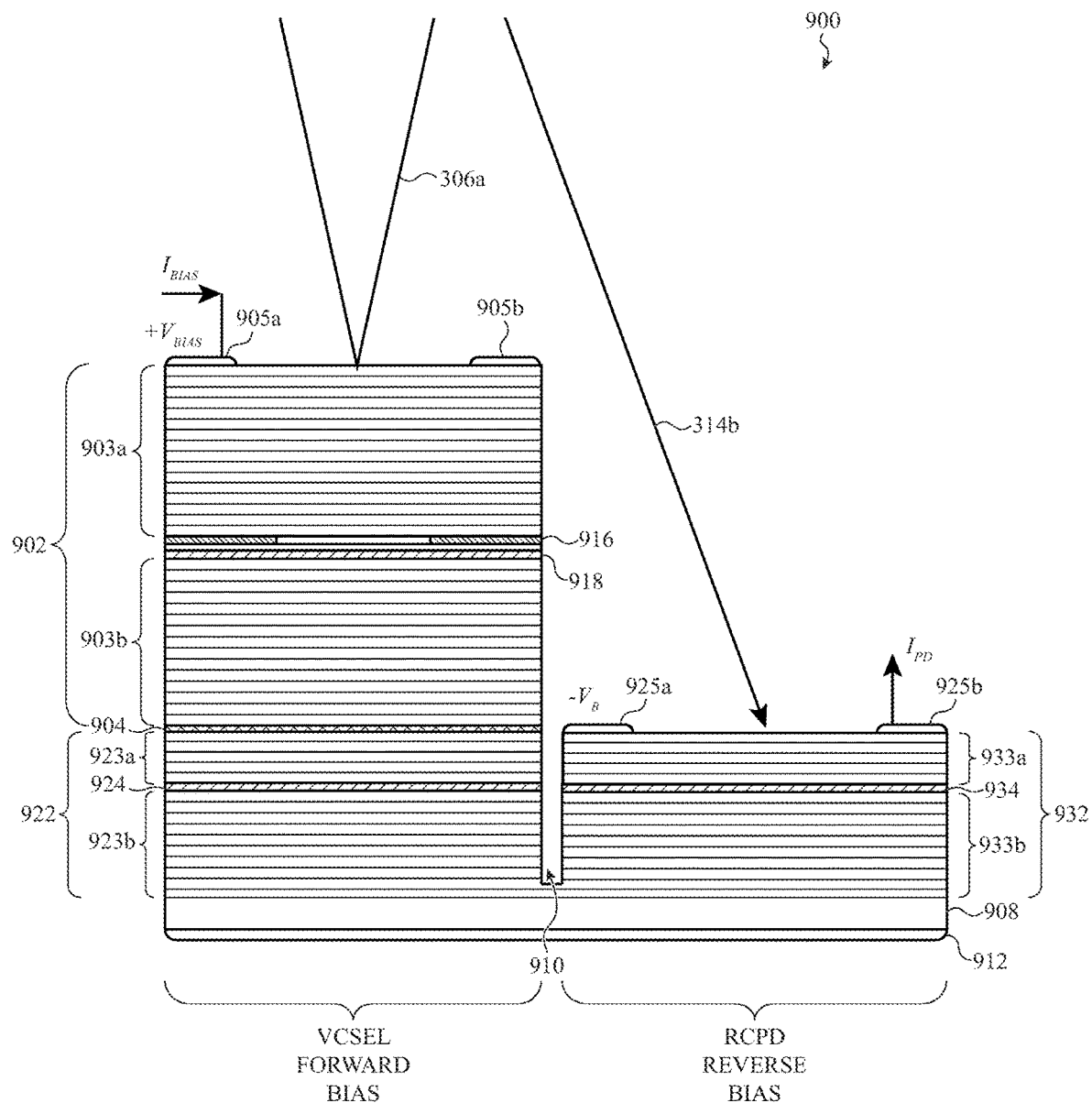
FIG. 9 illustrates a configuration of components of a self-mixing interferometry sensor, according to an embodiment.

FIG. 9 illustrates a configuration for a self-mixing interferometry sensor 900. The self-mixing interferometry sensor may include a VCSEL diode 902 and a laterally adjacent RCPD 932. The RCPD 932 is formed as part of a common set of semiconductor layers epitaxially formed on a substrate 908. The VCSEL diode 902 is formed vertically above the common set of semiconductor layers. A trench 910 may be etched at least partially through the common set of semiconductor layers to provide electrical separation between the VCSEL diode 902 and the RCPD 932.

The VCSEL diode 902 may include sequentially from the common set of semiconductor layers: an etch stop layer 904, semiconductor layers forming a base side distributed Bragg reflector 903b, an active region layer 918, an oxide layer 916, and semiconductor layers forming an emission side distributed Bragg reflector 903a. These parts of the VCSEL diode 902 are as described for VCSEL diode 802 of FIG. 8. Contacting the topmost layer of the VCSEL diode 902 are electrical supply contacts 905a and 905b, which may be connected.

The RCPD 932 may include sequentially from the substrate 908: semiconductor layers forming a base side distributed Bragg reflector 933b, an active region layer 934, and semiconductor layers forming an emission side distributed Bragg reflector 933a. The various layers for these three structures have respective lateral extensions, separated by the trench 910, beneath the VCSEL diode 902: layers 923b, layer 924, and layers 923a. These layers may be structured as an RCPD 922, as described previously. Further, such an RCPD 922 may also be used for detection of self-mixing interference in the laser light emitted by the forward biased VCSEL diode 802, as described for the embodiment of FIG. 8. There is an etch stop layer 904, which may be InGaP, between the layers 923a and the semiconductor layers of the base side distributed Bragg reflector 903b. Contacting the topmost layer of the RCPD 932 are electrical supply contacts 925a and 925b, which may be connected.

The self-mixing interferometry sensor 900 may be operated analogously to previous embodiments. A forward voltage bias $+V_{BIAS}$ is applied to the electrical supply contacts 905a and 905b, which induces a bias current $I_{BIAS}$ to flow into the VCSEL diode 902 and induce emission of laser light 306a, as described previously. If some of the emitted laser light 306a is reflected from an object (not shown) and is received in the VCSEL diode 902, self-mixing interference may occur that induces an alteration in the wavelength of the emitted laser light 306a.

For at least part of the time that the VCSEL diode 902 is emitting laser light, the RCPD 932 may be reverse biased by the application of a negative voltage $-V_{PD}$ at the electrical supply contact 925. Other reflections of the altered laser light may then be received in the RCPD 932, producing a measurable change in the photodetector current $I_{PD}$, or another electrical or interferometric property of the RCPD 922. Such a measurable change may be used to infer a distance or a motion of the reflecting object.

Figure 10:
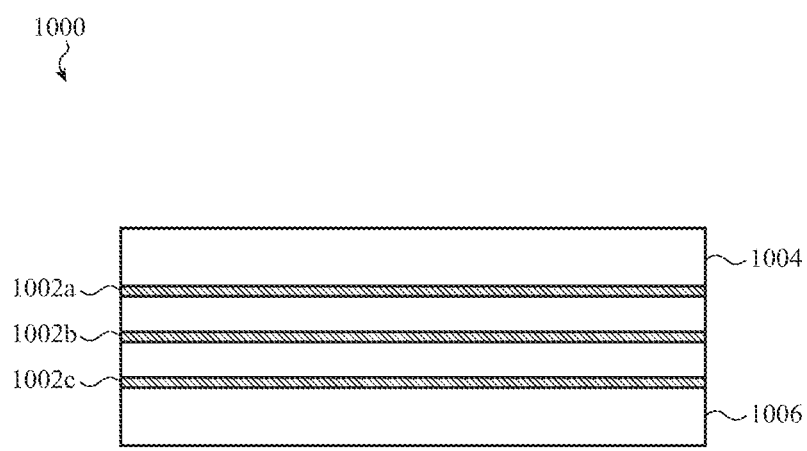
FIG. 10 illustrates a quantum well configuration for an active region layer, according to an embodiment.

FIG. 10 illustrates a quantum well configuration for an active region layer 1000 of a self-mixing interferometry sensor. The active region layer 1000 may include quantum wells 1002a-1002c and may be bounded by a first barrier 1004 and a second barrier 1006. In some embodiments, the active region layer 1000 may correspond to the active region layer 718 of the VCSEL diode 702 as discussed above with respect to FIGS. 7A and 7B. In such embodiments, the active region layer 1000 may be configured to emit light (e.g., photons) and the quantum wells 1002a-1002c may be forward biased quantum wells. In alternative or additional embodiments, the active region layer 1000 may correspond to the active region layer 724 of the RCPD 722 as discussed above with respect to FIGS. 7A and 7B. In such embodiments, the active region layer 1000 may be configured to absorb light (e.g., photons) and the quantum wells 1002a-1002c may be reverse biased. At the reverse bias, the Quantum Confined Stark Effect (QCSE) may make the quantum wells 1002a-1002c photon absorptive and may convert absorbed light to a photo-current signal.

In some embodiments, three quantum wells 1002a-1002c may be positioned in an active region layer 1000. In some embodiments, there may be up to six quantum wells present in the active region layer 1000. In further embodiments, there may be six or more quantum wells present in the active region layer 1000. In some embodiments, the thickness of each quantum well 1002a-1002c may be less than 10 nm. In some embodiments, the thickness of each quantum well 1002a-1002c may be equal to or greater than 10 nm. The quantum wells 1002a-1002c may be formed during the epitaxial growth process illustrated and described with respect to FIGS. 7A and 7B or may be formed during a reverse epitaxial growth process described with respect to FIG. 8.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A self-mixing interferometry (SMI) sensor, comprising a resonant cavity photodetector (RCPD) comprising a first set of semiconductor layers formed on a substrate, wherein the first set of semiconductor layers include:
a first emission side distributed Bragg reflector;
a first base side distributed Bragg reflector; and
a first active region layer positioned between the first emission side distributed Bragg reflector and the first base side distributed Bragg reflector; and
a vertical cavity surface emitting laser (VCSEL) diode comprising a second set of semiconductor layers formed on the first set of semiconductor layers, wherein the second set of semiconductor layers include:
a second emission side distributed Bragg reflector;
a second base side distributed Bragg reflector; and
a second active region layer positioned between the second emission side distributed Bragg reflector and the second base side distributed Bragg reflector.

2. The SMI sensor of claim 1, wherein:
the first set of semiconductor layers laterally extend beyond the second set of semiconductor layers; and
an etch stop layer is positioned between the first set of semiconductor layers and the second set of semiconductor layers.

3. The SMI sensor of claim 2, further comprising:
first and second electrical supply contacts positioned on an upper surface of the VCSEL diode; and
a third electrical supply contact positioned on a portion of the second set of semiconductor layers that laterally extends beyond the first set of semiconductor layers.

4. The SMI sensor of claim 3, wherein:
the VCSEL diode is configured to emit a laser light toward an object under forward bias to the first and second electrical supply contacts; and
the RCPD is configured to receive second reflections or backscatters of the emitted laser light from the object under a reverse bias to the third electrical supply contact.

5. The SMI sensor of claim 1, further comprising a ground contact layer coupled to the substrate, wherein the ground contact layer is positioned on an opposite side of the substrate as the first set of semiconductor layers.

6. The SMI sensor of claim 1, further comprising processing circuitry configured to:
measure a measurable parameter produced by the RCPD; and
determine at least one of a displacement or a motion of an object using at least the measured parameter.

7. The SMI sensor of claim 1, wherein:
the VCSEL diode is configured to emit a laser light under forward bias;
a first portion of the emitted laser light is directed toward an object separate from the SMI sensor; and
a second portion of the emitted laser light is directed toward the RCPD.

8. The SMI sensor of claim 1, wherein the VCSEL diode is configured to emit laser light with a natural wavelength of 940 nanometers.

9. A self-mixing interferometry (SMI) sensor, comprising:
a first set of semiconductor layers formed on a substrate, wherein the first set of semiconductor layers include a first active region layer positioned between a first emission side distributed Bragg reflector and a first base side distributed Bragg reflector;
a vertical cavity surface emitting laser (VCSEL) diode comprising a second set of semiconductor layers formed on the first set of semiconductor layers, wherein the second set of semiconductor layers include a second active region layer positioned between a second emission side distributed Bragg reflector and the second base side distributed Bragg reflector; and
a third set of semiconductor layers formed on the substrate and positioned laterally adjacent to the first set of semiconductor layers.

10. The SMI sensor of claim 9, wherein the third set of semiconductor layers include a third active region layer positioned between a first emission side distributed Bragg reflector and a first base side distributed Bragg reflector.

11. The SMI sensor of claim 9, wherein the VCSEL diode is configured to emit a laser light while forward biased and undergo self-mixing interference caused by receiving first reflections or backscatters from an object.

12. The SMI sensor of claim 11, wherein:
the first set of semiconductor layers is configured to receive second reflections or backscatters of the emitted laser light from the object;
the second set of semiconductor layers is configured to receive third reflections or backscatters of the emitted laser light from the object; and
determine at least one of a displacement or a motion of the object using outputs from the first set of semiconductor layers and the second set of semiconductor layers.

13. The SMI sensor of claim 11, wherein the first set of semiconductor layers and the second set of semiconductor layers are configured to be reverse biased during emission of the laser light by the VCSEL diode.

14. The SMI sensor of claim 9, further comprising:
first and second electrical supply contacts positioned on an upper surface of the VCSEL diode; and
third and fourth electrical supply contacts positioned on an upper surface of the second RCPD.

15. The SMI sensor of claim 14, wherein the first set of semiconductor layers and the third set of semiconductor layers are a same set of semiconductor layers, separated by a trench.

16. A self-mixing interferometry (SMI) sensor, comprising:
a resonant cavity photodetector (RCPD) comprising a first set of semiconductor layers formed on a substrate; and
a vertical cavity surface emitting laser (VCSEL) diode formed over the RCPD and comprising a second set of semiconductor layers formed on the first set of semiconductor layers; and
an etch stop layer between the first set of semiconductor layers and the second set of semiconductor layers;
wherein:
the VCSEL diode is configured to emit laser light when forward biased and undergo self-mixing interference upon reception of reflections or backscatters of the emitted laser light from an object, the self-mixing interference altering a property of the emitted laser light; and
the RCPD is configured to be reverse biased during emission of the laser light by the VCSEL diode and detect an alteration in the property of the emitted laser light.

17. The SMI sensor of claim 16, wherein:
the VCSEL diode additionally comprises a forward biased quantum well to emit light; and
the RCPD additionally comprises a reverse biased quantum well to absorb light.

18. The SMI sensor of claim 16, wherein the RCPD is a first RCPD and further comprising a second RCPD positioned laterally adjacent the first RCDP and comprising a third set of semiconductor layers formed on the substrate.

19. The SMI sensor of claim 18, further comprising processing circuitry that is configured to determine at least one of a displacement or a motion of the object using outputs from the first RCPD and the second RCPD.

* * * * *